US012153073B2

(12) United States Patent
Thomas et al.

(10) Patent No.: US 12,153,073 B2
(45) Date of Patent: Nov. 26, 2024

(54) DIAGNOSTIC CIRCUITS WITH DUPLICATE RESISTIVE NETWORKS FOR SENSOR OUTPUT BUFFERS

(71) Applicant: Allegro MicroSystems, LLC, Manchester, NH (US)

(72) Inventors: Matthieu Thomas, Prague (CZ); Radek Zeipl, Melnik (CZ); Petr Bily, Prague (CZ)

(73) Assignee: Allegro MicroSystems, LLC, Manchester, NH (US)

( * ) Notice: Subject to any disclaimer, the term of this patent is extended or adjusted under 35 U.S.C. 154(b) by 224 days.

(21) Appl. No.: 18/053,905

(22) Filed: Nov. 9, 2022

(65) Prior Publication Data
US 2024/0151751 A1    May 9, 2024

(51) Int. Cl.
*G01R 19/165*    (2006.01)
*G01R 15/20*    (2006.01)
(Continued)

(52) U.S. Cl.
CPC ..... *G01R 19/16571* (2013.01); *G01R 15/202* (2013.01); *G01R 15/205* (2013.01);
(Continued)

(58) Field of Classification Search
CPC .... G01R 15/202; G01R 15/205; G01R 19/10; G01R 19/16571; G01R 31/2829; H03K 19/20; H03K 5/24
See application file for complete search history.

(56) References Cited

U.S. PATENT DOCUMENTS 5,493,214 A * 2/1996 Good ................. G01D 3/08
324/225
10,001,519 B2   6/2018 Choe et al.
(Continued)

FOREIGN PATENT DOCUMENTS

DE     102019134300 B4 *  6/2024  ............. G01R 15/04

OTHER PUBLICATIONS

Pepka, Gary, "Magnetic Sensor ICs Offer Integrated Diagnostics for ASIL Compliance"; Design News, Feb. 2014, Allegro MicroSystems, LLC; 5 pages.

*Primary Examiner* — Jay Patidar
(74) *Attorney, Agent, or Firm* — DALY, CROWLEY, MOFFORD & DURKEE, LLP

(57) ABSTRACT

Output buffer diagnostic circuits for monitoring a sensor output buffer include a duplicate resistive network corresponding to a resistive network in the monitored sensor output buffer. The duplicate resistive network may include the same or similar topology as the output buffer resistive network. The duplicate resistive network is configured to produce a differential duplicate signal indicative of when an error condition exits in the sensor output buffer. The diagnostic circuit can include averaging circuitry configured to receive the differential duplicate signal and produce an average duplicate signal. The diagnostic circuit can include an error comparison circuit configured to receive the average duplicate signal and detect when the average duplicate signal exceeds a nominal or preset error value corresponding to an error condition in the sensor output buffer. The error comparison circuit is configured to produce an error indication when the average duplicate signal exceeds the preset error value.

36 Claims, 14 Drawing Sheets

(51) Int. Cl.
  *G01R 19/10* (2006.01)
  *H03K 5/24* (2006.01)
  *H03K 19/20* (2006.01)

(52) U.S. Cl.
  CPC ............... *G01R 19/10* (2013.01); *H03K 5/24* (2013.01); *H03K 19/20* (2013.01)

(56) References Cited

U.S. PATENT DOCUMENTS

| | | |
|---|---|---|
| 10,325,836 B1 | 6/2019 | Rigoni et al. |
| 10,527,703 B2 | 1/2020 | Monreal et al. |
| 10,580,289 B2 | 3/2020 | Haas et al. |
| 10,636,285 B2 | 4/2020 | Haas et al. |
| 10,692,362 B2 | 6/2020 | Petrie et al. |
| 11,194,004 B2 | 12/2021 | Scheller et al. |
| 2019/0025374 A1* | 1/2019 | Drouin ............. G01R 31/31905 |
| 2022/0196739 A1* | 6/2022 | Rubinsztain ....... G01R 31/2829 |

* cited by examiner

DIAGNOSTIC CIRCUITS WITH DUPLICATE RESISTIVE NETWORKS FOR SENSOR OUTPUT BUFFERS

BACKGROUND

Electronic circuits are used in used in many various applications, including some that are subject to safety requirements. For example, some electronic circuits may be used for automotive systems that are required to conform to certain safety specifications such as the Automotive Safety Integrity Level (ASIL) risk classification defined by the ISO 26262 standard ("Functional Safety for Road Vehicles"). Such circuits often include various sensors, e.g., photodetectors, accelerometers, temperature sensors, and current sensors, etc. The sensors typically include a transducer that converts physical stimuli into analog electrical signals, a preamplifier that provides some signal conditioning and amplification, and an output buffer that provides further signal conditioning and/or amplification of the analog signals.

An example of a typical architecture of an electric current sensor 100 is depicted in FIG. 1. As shown, current sensor 100 can include a transducer 110 that converts a sensed magnetic field 102 to a voltage, a pre-amplifier stage 120 that amplifies the signal from the transducer, and an output buffer stage 130 that provides the necessary drive to interface with external circuitry presenting resistive and capacitive loads. The general architecture shown can be employed not just for current sensors but also for other types of sensors when used with a corresponding transducer, e.g., for temperature, pressure, etc.

Sensor output buffer stages (a.k.a., output buffers), such as buffer stage 130 of FIG. 1, can experience errors in offset or gain (or both) that affect accuracy of sensor measurements. Some safety requirements for electric current sensors typically specify that any gain or offset error beyond a certain threshold shall be reported to the related system using the sensor.

FIG. 2 is a graph 200 showing an example of maximum allowable output voltage error versus output voltage for an example current sensor. Graph 200 depicts both offset error threshold 202 and gain error threshold (maximum sensor error*sensed field) 204. Quiescent voltage output (QVO), the sensor output voltage in the absence of input field, is also shown. Positive and negative excursions, corresponding to differential outputs, are indicated.

SUMMARY

An aspect of the present disclosure includes an output buffer diagnostic circuit for a sensor output buffer. The output buffer diagnostic circuit may also include a duplicate resistive network configured to receive the differential input signal supplied to the sensor output buffer, the output voltage, and a reference voltage. The duplicate resistive network may include the same (or similar) topology as the output buffer resistive network. The duplicate resistive network may be configured to produce a differential duplicate signal based on the differential input signal, the output voltage, and a reference voltage. The differential duplicate signal can be indicative of when an error condition exits in the sensor output buffer. The circuit may include averaging circuitry configured to receive the differential duplicate signal and produce an average duplicate signal. The circuit may include an error comparison circuit configured to receive the average duplicate signal and detect when the average duplicate signal exceeds an error value corresponding to an error condition in the sensor output buffer, and where the error comparison circuit is configured to produce an error indication when the average duplicate signal exceeds the error value.

Implementations may include one or more of the following features. The duplicate resistive network may include R1 and R2 resistors, e.g., with the ratio of R1 to R2 being the same as (or similar to) that of corresponding resistors in the output buffer resistive network. The duplicate differential signal can correspond to a differential input signal applied to an amplifier in the output buffer resistive network. Averaging circuitry may include a delta-sigma modulator configured to convert the differential duplicate signal to a bitstream. The circuit may include a digital filter configured to average the bitstream produced by the delta-sigma modulator. The circuit may include an output-operating-range (OOR) detector configured to determine when the sensor output buffer is operating outside of a linear output operating range. The OOR detector may be configured to monitor the buffer output signal. The OOR detector may include a first comparator configured to receive the buffer output signal and compare the buffer output signal to a positive threshold, where the first comparator can be configured to produce an above-threshold signal when the buffer output signal exceeds the positive threshold. The OOR detector may include a second comparator configured to receive the buffer output signal and compare the buffer output signal to a negative threshold, where the second comparator can be configured to produce a below-threshold signal when the buffer output signal is below the negative threshold. The OOR detector may include a logical or unit connected to the first and second comparators and configured to, in response to receiving an above-threshold signal or a below-threshold signal, produce an output signal indicating the buffer output signal is outside of the linear operating range (OOR). The output buffer diagnostic circuit may be configured to enter a reset condition in response to receiving the OOR detector output signal indicating the buffer output signal is outside of the linear operating range, where operation of the output buffer diagnostic circuit is paused during the reset condition.

The OOR detector circuit may include a first comparator configured to receive a positive excursion signal of the differential input signal and compare the positive excursion signal to a positive threshold. The first comparator may be configured to produce an above-threshold signal when the positive excursion signal exceeds the positive threshold. The OOR detector circuit may include a second comparator configured to receive a negative excursion signal of the differential input and compare the negative excursion signal to a negative threshold. The second comparator may be configured to produce a below-threshold signal when the negative excursion signal is below the negative threshold. The OOR detector circuit may include an error detection unit configured to, in response to receiving an above-threshold signal or a below-threshold signal, produce an output signal indicating the buffer output signal is outside of the linear operating range. The OOR detector may include a plurality of resistors, where each input of the first and second comparators can be connected to a resistor. The resistors may have identical or similar resistance values in some examples. Each resistor may be connected to a current source and a current sink configured to cause a desired voltage-drop (e.g., Vshift) across the respective resistor.

The circuit may include a level detector configured to determine when the differential input signal exceeds a threshold value magnitude indicative of the buffer output signal moving outside of the OOR. The OOR detector circuit may be configured to monitor the differential input signal supplied to the sensor output buffer. The OOR detector circuit may include conversion circuitry configured to convert the differential input signal into two single-ended signals referenced to ground, where the two single-ended signals include a positive excursion signal and a negative excursion signal. The OOR detector may include a first comparator configured to receive the positive excursion signal and compare the positive excursion signal to a positive threshold, where the first comparator can be configured to produce an above-threshold signal when the positive excursion signal exceeds the positive threshold. The OOR detector may include a second comparator configured to receive the negative excursion signal and compare the negative excursion signal to a negative threshold, where the second comparator can be configured to produce a below-threshold signal when the negative excursion signal is below the negative threshold. The OOR detector may include an error detection unit configured to, in response to receiving an above-threshold signal or a below-threshold signal, produce an out-of-operating range (OOR) output signal indicating the buffer output signal is outside of the linear operating range. The output buffer diagnostic circuit may be configured to enter a reset condition in response to receiving the OOR detector output signal, where operation of the output buffer diagnostic circuit is paused during the reset condition. The circuit may include a sensor output buffer including an output buffer resistive network having a topology. The topology may include a summing configuration for receiving first and second differential input signals. The sensor output buffer may be configured to receive the differential input signal from a sensor circuit including a sensor. The sensor may include a magnetic field sensor. The magnetic field sensor may include one or more Hall effect elements. The magnetic field sensor may include one or more magnetoresistance elements. The sensor may include a current sensor. The differential input signal may include a differential voltage signal. The buffer output signal may include a voltage signal.

Another aspect of the present disclosure includes an output buffer diagnostic circuit for a sensor output buffer. The output buffer diagnostic circuit may include a duplicate resistive network configured to receive the differential input signal and produce a differential duplicate signal based on the differential input signal, where duplicate resistive network may include the same (or similar) topology as the output buffer resistive network. The differential duplicate signal can be indicative of whether an error condition exits in the sensor output buffer; conversion circuitry configured to receive the differential duplicate signal and produce a single-ended duplicate signal. The circuit may include an error comparison circuit configured to receive the single-ended duplicate signal and detect when the single-ended duplicate signal exceeds an error value corresponding to an error condition in the sensor output buffer. The error comparison circuit may be configured to produce an error indication when the single-ended duplicate signal exceeds the error value.

Implementations may include one or more of the following features. The conversion circuitry may include averaging circuitry configured to receive the differential duplicate signal and produce an average duplicate signal, where the single-ended duplicate signal may include the average duplicate signal. The output-operating-range diagnostic circuit may be configured to produce an error warning when the sensor output buffer is operating outside of a linear output operating range. The output-operating-range diagnostic circuit may be configured to monitor the buffer output signal. The output-operating-range diagnostic circuit may be configured to monitor the differential input signal supplied to the sensor output buffer. The circuit may include a sensor output buffer including an output buffer resistive network having a topology. The sensor output buffer may be configured to receive the differential input signal from a sensor circuit including a sensor. The sensor circuit may include a pre-amplifier configured to receive a sensor output signal from the sensor and to produce a pre-amplifier output signal may include an amplified version of the sensor output signal, where the sensor output buffer is configured to receive the pre-amplifier output signal. The sensor may include a current sensor. The differential input signal may include a differential voltage signal. The buffer output signal may include a voltage signal.

Other embodiments of the aspects and examples described may include corresponding computer systems, apparatus, and computer programs recorded on one or more computer storage devices, each configured to perform the actions of the methods as described herein. A computer system of one or more computers can be configured to perform particular operations or actions, as described herein, by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

An aspect of the present disclosure is directed to diagnostic circuits that can be used to monitor operation of various sensors for correct operation. Examples can include resistive networks that duplicate those of the output buffers used for the sensors.

Figure 3:
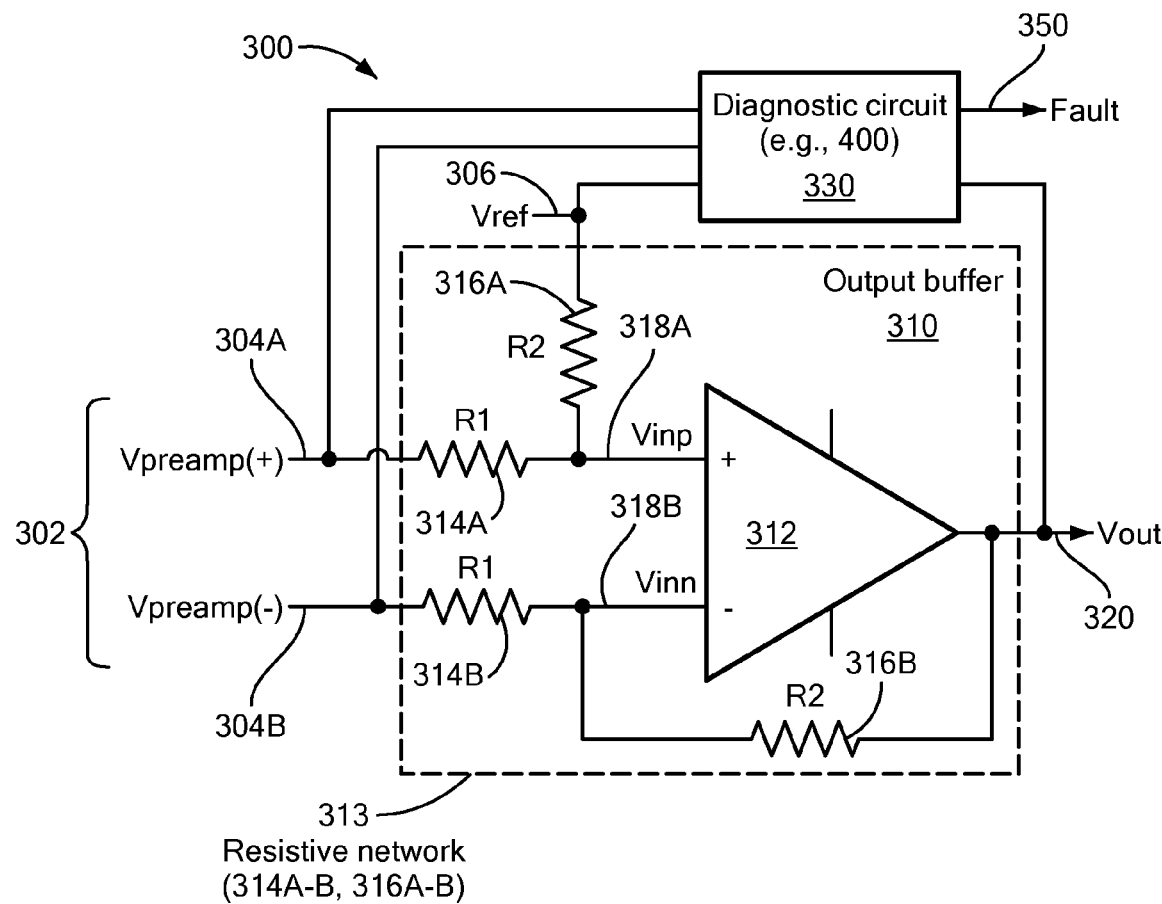
FIG. 3 is a diagram of an example analog output buffer with diagnostic circuit, in accordance with the present disclosure.

FIG. 3 is a diagram of an example analog output buffer and diagnostic circuit 300, in accordance with the present disclosure. Circuit 300 can include an output buffer 310 (a.k.a., buffer stage or driver) and a diagnostic circuit 330. Output buffer 310 can include an amplifier 312 and a resistive network 313 having a pair of first resistors 314A-B (R1), and a pair of second resistors 316A-B (R2). Buffer 310 can be configured to receive an input 302, e.g., differential voltages on inputs 304A-B, and a reference voltage (Vref) 306 and to produce an output signal at output 320. The first resistors 314A-B (R1) and second resistors 316A-B (R2) can be used to form a pair of voltage dividers (R1/(R1+R2)) for input voltages ($V_{IN}$ positive, $V_{IN}$ negative) 318A-B to amplifier 312, as shown.

Figure 1:
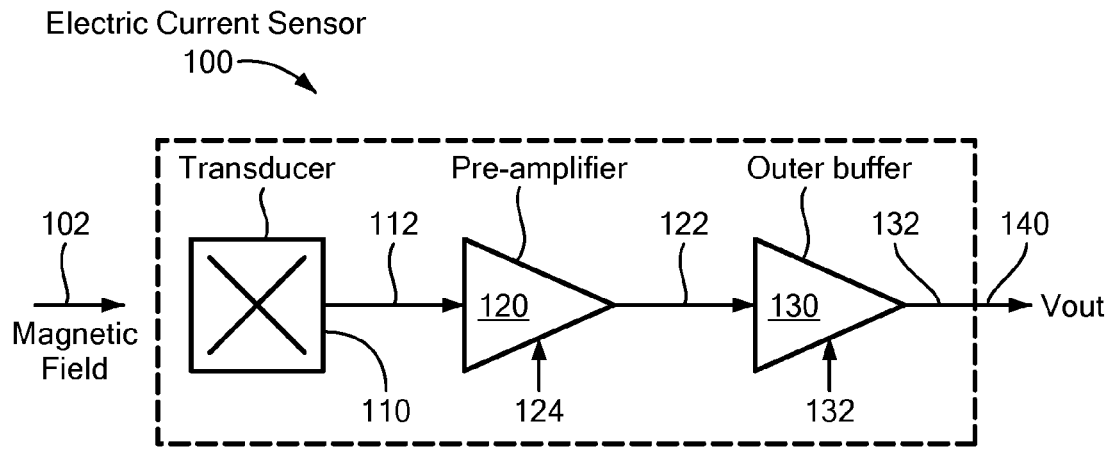
FIG. 1 is a diagram showing an example of a typical architecture of a current sensor.

The output buffer 310 can be configured to convert a differential voltage 304A-B (shown as Vpreamp), e.g., as received from a pre-amplifier such as 120 in FIG. 1, to a single-ended signal centered around a pre-determined voltage (shown as Vref). Output buffer 310 can also provide additional amplification of the signal depending on the R2/R1 ratio.

When output buffer 310 is working in a closed-loop, and assuming the open-loop gain of the amplifier is very high such that its behavior can be modeled by an ideal operational amplifier, then the ideal transfer function of the buffer 310 can be written as:

$$Vout = \frac{R2}{R1} * Vpreamp + Vref \quad \text{(EQ. 1)}$$

Diagnostic circuit 330 can include a resistive network, which, for diagnostic purposes, can essentially match or duplicate the resistive network 313 of the output buffer 310, including a similar or identical topology and resistances of first resistors 314A-B (R1) and second resistors 316A-B (R2), as described in more detail below, e.g., for FIG. 4.

Figure 4:
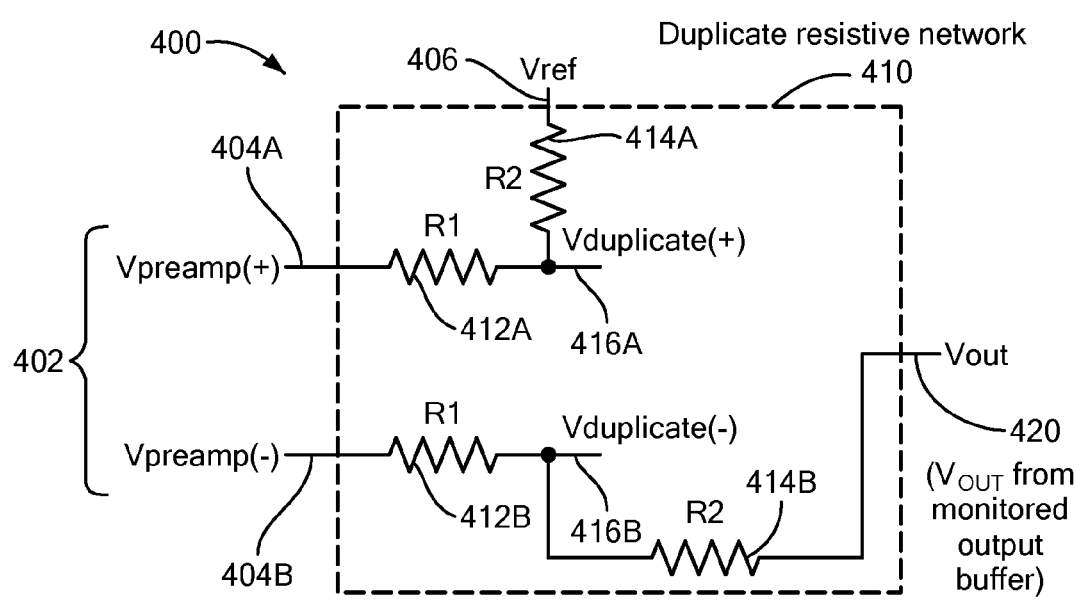
FIG. 4 is a diagram of an example duplicate resistive network used as a diagnostic circuit for an output buffer, in accordance with the present disclosure.

FIG. 4 is a diagram of an example duplicate resistive network circuit 400 used as a diagnostic circuit for an output buffer, in accordance with the present disclosure. Circuit 400 can include one or more inputs (e.g., terminals or nodes) configured to receive an input 402 (e.g., differential voltages 404A-B, etc.), a reference voltage input 406, and a resistive network 410 having multiple resistors 412A-B, 414A-B. Circuit 400 is configured to receive as an input (at 420) an output signal (Vout) from the output buffer that is monitored, e.g., output buffer 310 of FIG. 3. Portions/locations 416A-B of the circuit 400 provide duplicate voltages (Vduplicate(+) and Vduplicate(−)) that correspond to input voltages at the amplifier of the corresponding output buffer that circuit 400 is configured to monitor, e.g., input voltages 318A-B of amplifier 312 in FIG. 3.

Examples of the present disclosure include a diagnostic circuit having a duplicate (or near duplicate) of the resistor network connected around the differential amplifier, e.g., as depicted in FIG. 4. In examples of the present disclosure, a duplicate resistive network includes identical (or near identical) topology and the same (or similar) R1-to-R2 resistor ratio as the resistor network in the output buffer, e.g., as shown in FIG. 3. The voltage at the output of such a duplicate network can be given by:

$$Vduplicate = \frac{R2}{R1+R2} * Vpreamp - \frac{R1}{R1+R2} * Vout + \frac{R1}{R1+R2} * Vref \quad \text{(EQ. 2)}$$

As can be verified, when Vout in EQ. 2 is replaced by right side of EQ. 1, then Vduplicate=0. Assuming the presence of an offset error "Verror" within the output buffer, EQ. 1 would accordingly become:

$$Vout = \frac{R2}{R1} * Vpreamp + Vref + Verror \quad \text{(EQ. 3)}$$

Replacing Vout in EQ. 2 by the right side of EQ. 3:

$$Vduplicate = -\frac{R1}{R1+R2} * Verror \quad \text{(EQ. 4)}$$

Figure 2:
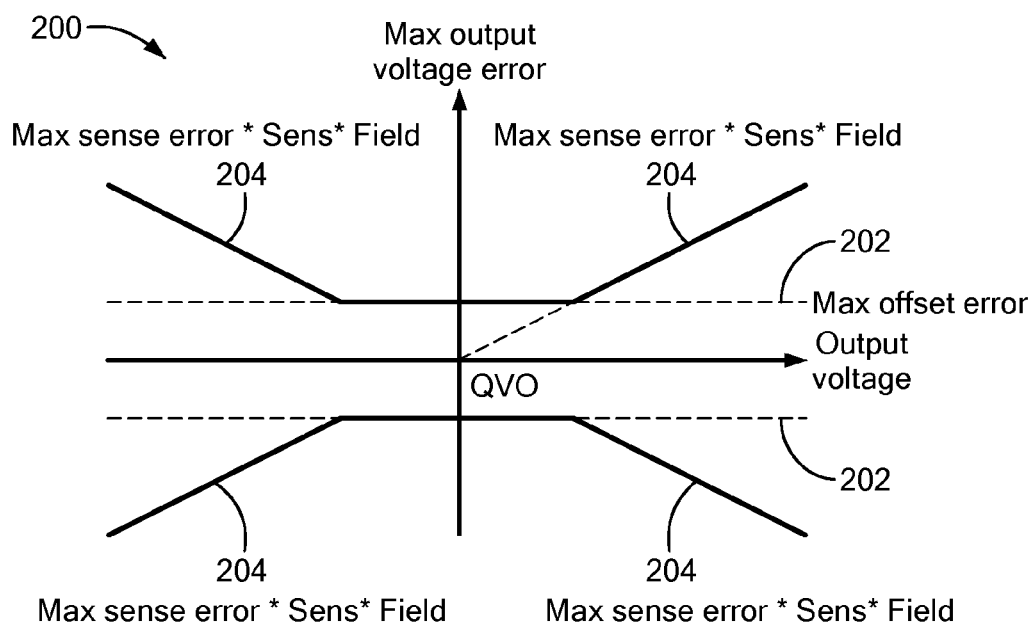
FIG. 2 is a graph showing an example of maximum allowable output voltage error versus output voltage for a current sensor.

Thus, any fault within the output buffer, e.g., buffer 310 in FIG. 3, leading to a deviation of its transfer function from the expected behavior depicted by EQ. 1, could be detected by monitoring the voltage Vduplicate in the duplicate resistive network of the diagnostic circuit, e.g., circuit 400 of FIG. 4. Detection of an offset error and guaranteeing it is below the specified maximum offset error can meet specified safety requirements, e.g., such as the one shown in FIG. 2. Using a duplicate resistive network in accordance with the present disclosure is thus a simple, passive way to sense errors within an output buffer.

Figure 5:
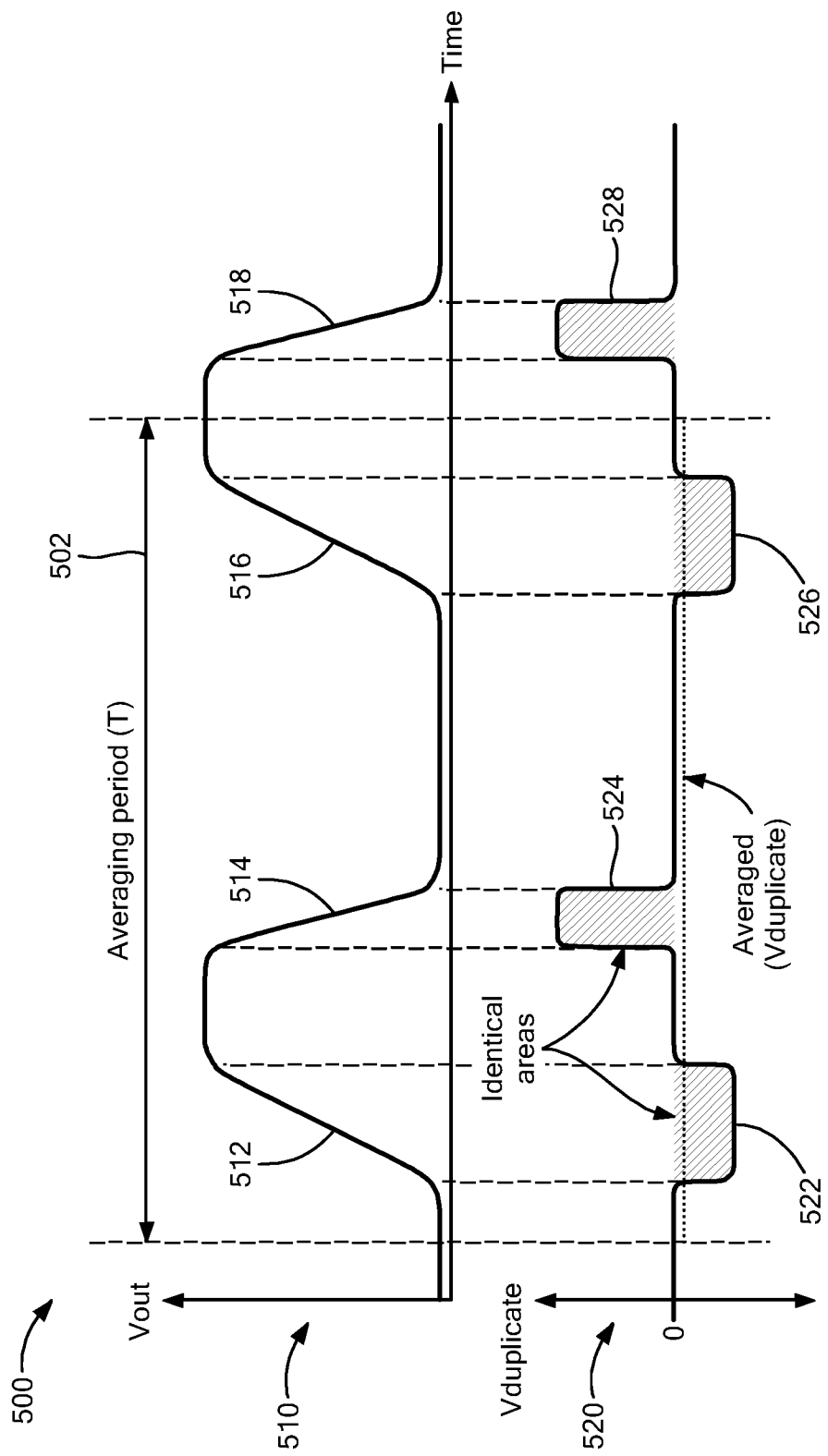
FIG. 5 includes two plots of output voltage showing an example of averaging of transient effects provided by a duplicate resistive network used as a diagnostic circuit, in accordance with the present disclosure.

One aspect of the present disclosure provides for averaging of Vduplicate to reduce the effect of transient events on Vout, as shown by FIG. 5. FIG. 5 includes two plots 510, 520 of output voltage vs. time showing an example of transient-effect averaging provided by a resistive network used as a diagnostic circuit, in accordance with the present disclosure. Plot 510 is for an amplifier of a sensor output buffer, e.g., similar to output buffer 310 of FIG. 3. Plot 520 is for a related diagnostic duplicate resistive network, e.g., similar to resistive network 410 of FIG. 4.

As shown for plot 510, in the presence of fast transients events, e.g., input voltages, the amplifier may not behave as an ideal operational amplifier, causing the duplicate resistive network to produce a Vduplicate that is not zero even in the absence of Faults in the output buffer as shown by plot 520. In such a condition, a diagnostic circuit including the duplicate resistive network could erroneously indicate or report a diagnostic error or fault. For example, a worst-case transition may occur during a transition from minimum to maximum output voltage.

As shown by plot 520, the duplicate resistive network can provide a beneficial averaging property such that the averaged signal generated on Vduplicate (e.g., 522) by a positive transition on Vout (e.g., 512) is equal in area to the averaged signal (e.g., 524) generated during a negative transition on Vout (e.g., 512) but with opposite polarity. Furthermore, over a given period of time (averaging period, T) the number of worst-case positive transitions 512, 516 will be equal to the number of worst-case negative transitions 514, 518, plus or minus one (+/−1) (with Vout being bounded by the supply range). Thus, when averaging Vduplicate over a given duration, the residual disturbance caused by multiple transitions on Vout will be at most the disturbance of a single worst-case transition. Accordingly, averaging Vduplicate over a long period of time can be an effective way to reduce the relative effect of transient events on Vout. Dashed vertical lines indicate correspondence between changes in the slope shown in plot 510 and the area under the curve shown in plot 520.

Figure 6:
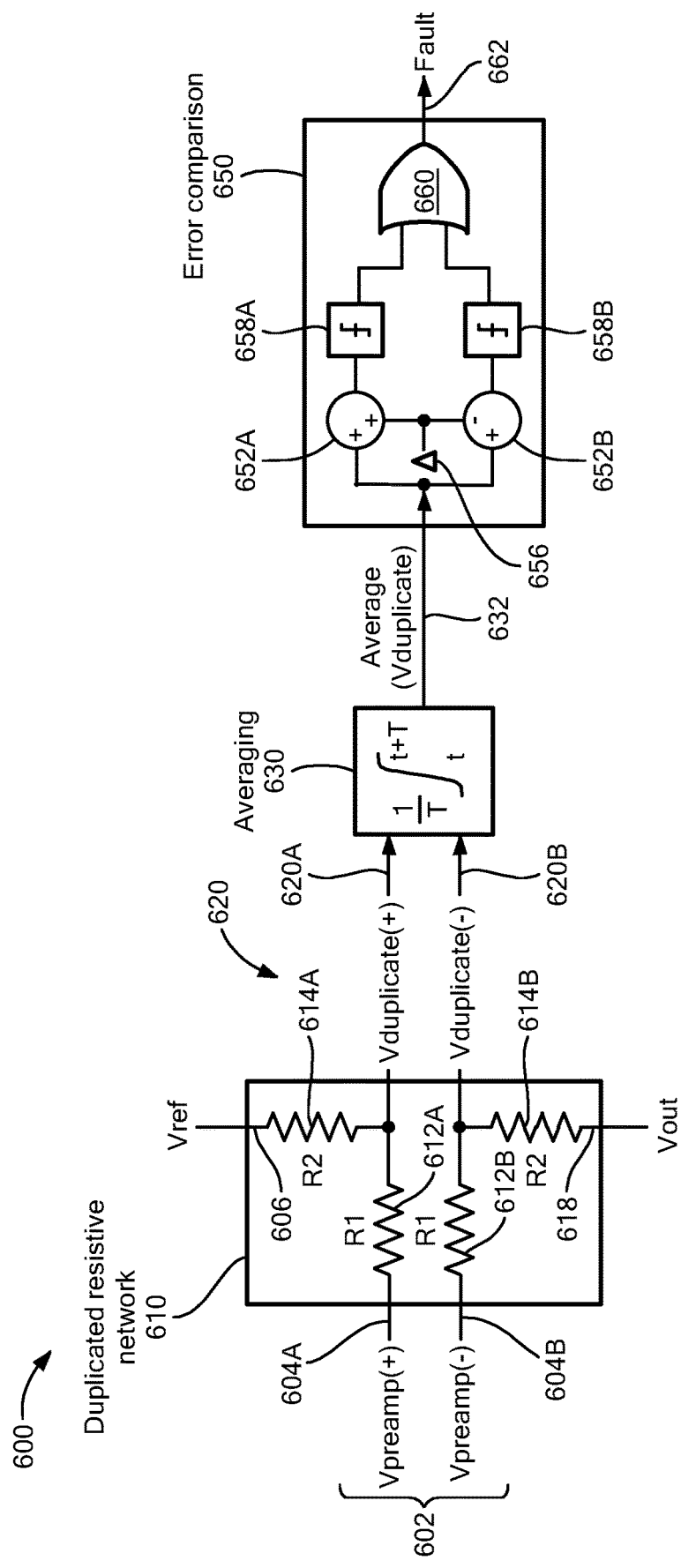
FIG. 6 is a diagram of an example output buffer diagnostic circuit, in accordance with the present disclosure.

FIG. 6 is a diagram of an example output buffer diagnostic circuit 600, in accordance with the present disclosure. Diagnostic circuit 600 can include a duplicate resistive network identical 610 to the resistive network in a related (monitored) sensor output buffer (not shown). The duplicate resistive network 610 can be used to sense potential errors in the output voltage Vout caused by malfunction of the output buffer. Circuit 600 can include an averaging circuit 630 used to reduce the weight of dynamic errors generated by transitions on Vout 618 of the output buffer. Circuit 600 can also include an error comparison circuit 650 which detects if the averaged duplicated signal exceeds an allowed offset error.

The duplicate resistive network 610 receives an input 602, e.g., a differential input 604A-B, such as from a sensor pre-amplifier used for the related sensor output buffer. The duplicate resistive network 610 is configured to receive a reference voltage Vref 606, e.g., as provided to the related sensor output buffer. The duplicate resistive network 610 is configured to receive an output voltage Vout 618 from the related sensor output buffer. The duplicate resistive network includes a network of resistors, e.g., 612A-B (R1), 614A-B (R2), having the same (or similar) topology and R1/R2 ratio as that of the related sensor output buffer that is monitored by diagnostic circuit 600. The duplicate resistive network 610 is configured to produce an output 620, which can include a differential output 620A-B that corresponds to the input voltages to the amplifier in the related sensor output buffer (e.g., 318A-B in FIG. 3).

The averaging circuit 630 is configured to receive the output 620 (e.g., differential output 620A-B) from the duplicate resistive network 610. The averaging circuit 630 operates to average the output 620 over a given time period T and produce an average Vduplicate signal 632, which can be a single-ended signal, as shown.

The error comparison circuit 650 is configured to receive the average Vduplicate signal 632 from the averaging circuit 630 and compare the Vduplicate signal 632 to one or more thresholds, e.g., corresponding to a permissible offset error. Comparison circuit 650 can include first and second summation elements 652A-B, e.g., configured to add and subtract a reference voltage value (A) 656 to Vduplicate 632, as shown. Circuit 650 can include comparators 658A-B configured to receive the signals from the summation elements 652A-B to determine whether Vduplicate has exceeded a positive or negative excursion threshold. Comparators 658A-B can be connected to an OR element 660, as shown, which can produce an output 662 indicating a fault when either comparator 658A or 658B indicates that an operational threshold has been exceeded.

Implementing large time constants, e.g., as may be used by Vduplicate averaging, can be costly in term of area (chip footprint) when realized in analog circuitry. To reduce area needed, examples of the present disclosure can implement averaging functionality with the combination of a delta-sigma modulator which converts Vduplicate to a bitstream and a digital filter which averages the delta-sigma bitstream. The obtained solution has the advantage to allow implementation of very long averaging time for a low cost in term of area. An example of such a delta-sigma implementation is depicted in FIG. 7.

Figure 7:
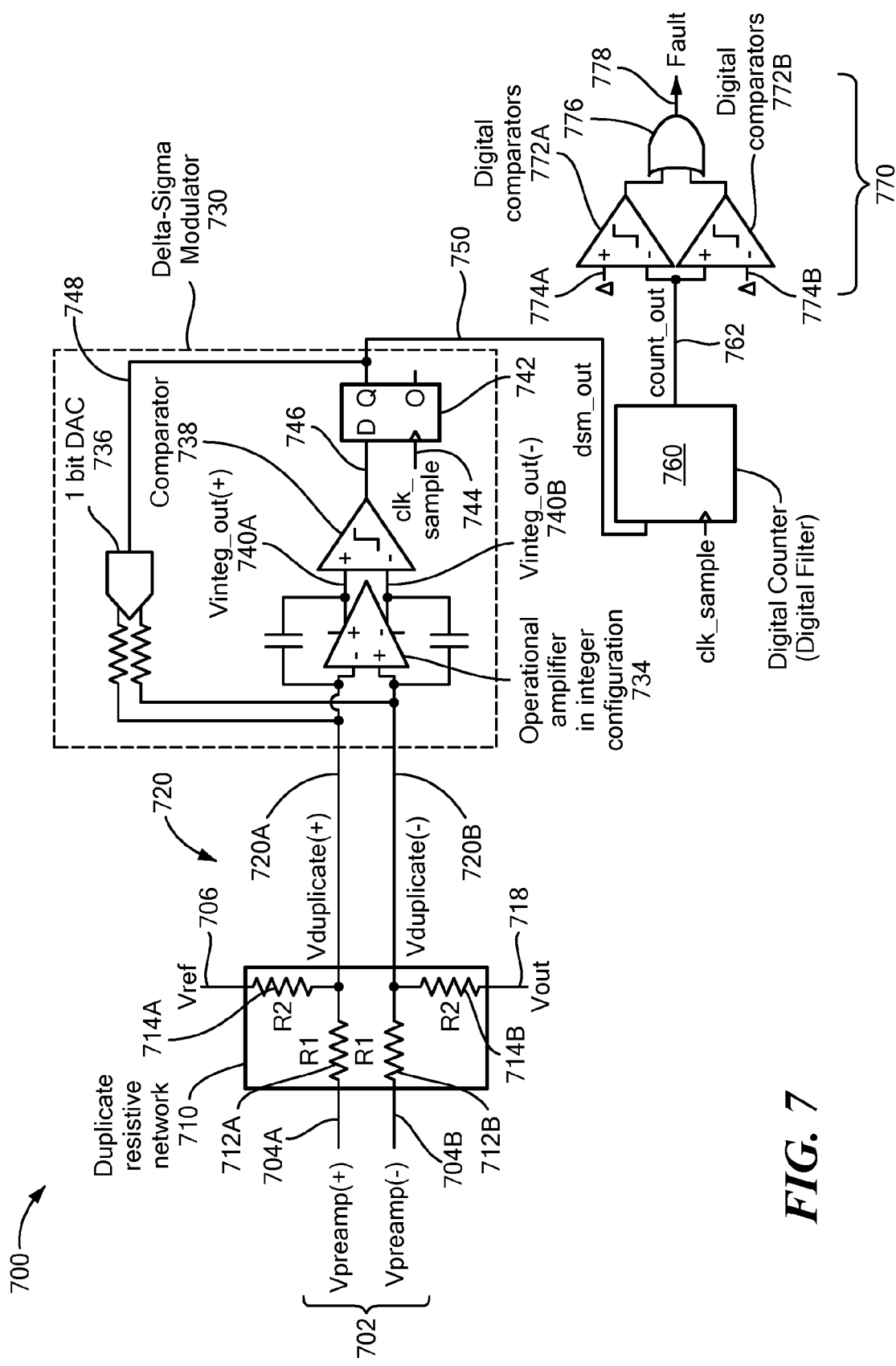
FIG. 7 is a diagram of an example output buffer diagnostic circuit including a delta-signal modulator, in accordance with the present disclosure.

FIG. 7 is a diagram of an example output buffer diagnostic circuit 700 including a delta-sigma modulator, in accordance with the present disclosure. Circuit 700 can provide for digital implementation of averaging functionality for a buffer output diagnostic circuit by using delta-sigma modulation, digital averaging, and comparison to thresholds.

Circuit 700 can include a duplicate resistive network 710, a delta-sigma modulator section 730, a digital counter (digital filter) 760, and an error comparison section 770. Duplicate resistive network 710 can include multiple resistors (e.g., resistors 712A-B and 714A-B) and can be configured to have the same topology as that of the resistive network of a sensor output buffer that that is monitored by circuit 700. Duplicate resistive network 710 can receive an input 702, e.g., differential input voltages 712A-B. Duplicate resistive network 710 can receive reference voltage (Vref) 716 and an output voltage (Vout) 718 from the monitored output buffer (e.g., similar to 320 shown in FIG. 3). Duplicate resistive network 710 can produce differential output voltages (Vduplicate) 720A-B, corresponding to the voltages supplied to the amplifier of the monitored output buffer (e.g., amplifier 312 in FIG. 3).

Delta-sigma modulator section 730 can include an amplifier 734, e.g., an operational amplifier in an integrator configuration, configured to receive differential Vduplicate 720A-B signals from duplicate resistive network 710. Delta-sigma modulator section 730 can include comparator 738, which can receive outputs 740A-B from amplifier 734. Comparator 738 can produce an output 746 which can be provided, e.g., as a data input, to latch (flip-flop) 742. Latch 742 can receive an input, e.g., clk_sample, on a clock input 744, as shown. An output 750 (e.g., on a data output) of latch 742 can be received by one-bit digital-to-analog converter (DAC) 736, which can be configured in a feedback loop to differential Vduplicate 720A-B signals. Output 750 can be received by digital counter 760, which can also receive a clock input, e.g., clk_sample. Digital counter 760 can produce an output, e.g., count_out 762, as shown.

Error comparison section 770 can be configured to receive the count_out 762 from digital counter 760. Error comparison section 770 can compare the count_out 762 to one or more thresholds, e.g., corresponding to a permissible offset error. For example, comparison circuit 770 can include first and second comparators 772A-B configured to compare count_out 762 to high and low thresholds 774A-B to determine whether Vduplicate has exceeded a high or low count_out threshold 774A-B. Comparators 772A-B can be connected to an OR (gate) element 776, as shown, which can produce an output 778 indicating a fault when either comparator 772A or 772B indicates that an operational threshold has been exceeded.

Figure 8:
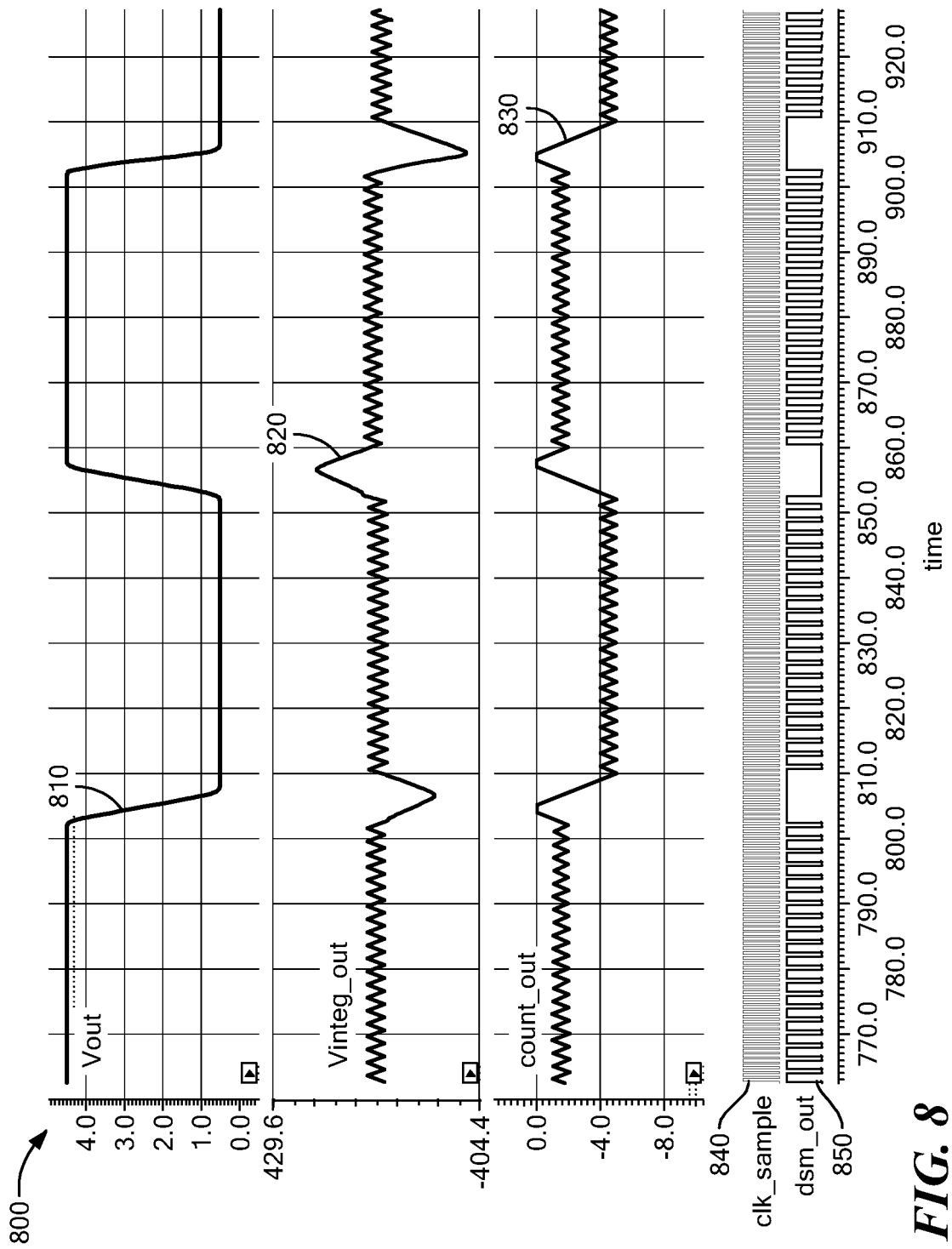
FIG. 8 incudes a set of plots showing an operation of the circuit of FIG. 7, in accordance with the present disclosure.

FIG. 8 incudes a set 800 of plots showing an example operation of the diagnostic circuit 700 of FIG. 7, in accordance with the present disclosure. An example of a buffer output voltage Vout is shown at 810. Corresponding Vinteg_out is shown at 820 while a corresponding count_out is shown at 830. A clock sample clk_sample is shown at 840. A corresponding output from a delta-sigma modulator dsm_out is shown at 850.

Examples described above have included a simple resistive network as a duplicate resistive network, for the sake of simplicity. The ideas and concepts of the present disclosure are not limited to such a configuration and are applicable for other cases where the resistive network within an output buffer has different or more complex configurations. One illustrative example of such a resistive network configuration is shown by the summing configuration shown in FIG. 9. Other resistive network configurations may of course be employed within the scope of the present disclosure.

Figure 9:
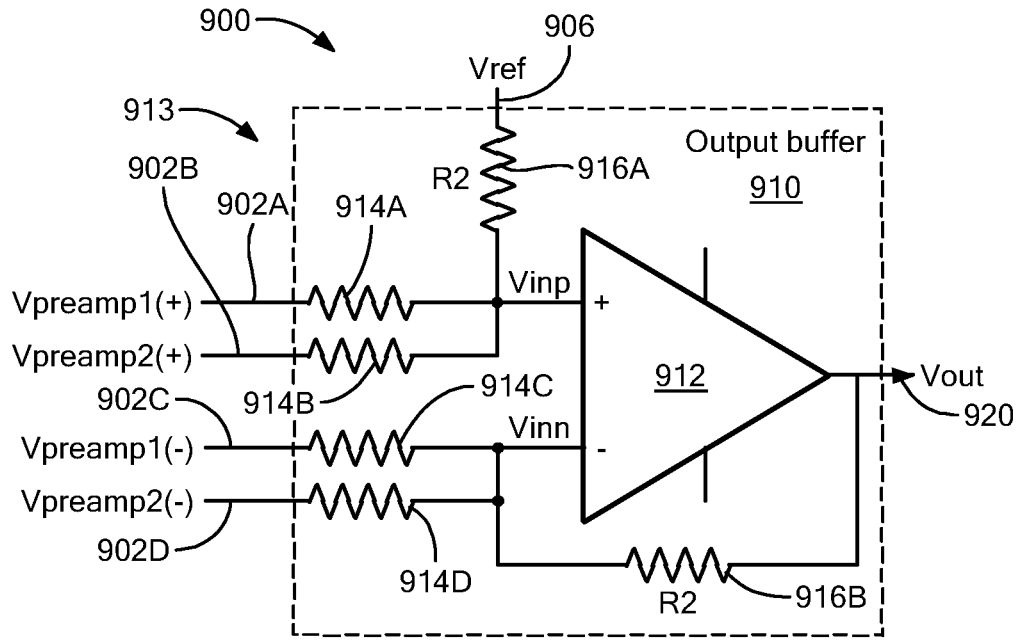
FIG. 9 is a is a block diagram of an alternate example of a resistive network for use with an output buffer, in accordance with the present disclosure.

FIG. 9 is a block diagram of an example of an alternate output buffer circuit 900, in accordance with the present disclosure. Circuit 900 can include an output buffer 910 configured to receive multiple inputs, e.g., a pair of differential inputs 902A, 902C and 902B, 902D from a preamplifier and to receive a reference voltage 906. Output buffer may also include an amplifier 912. Circuit 900 can include a resistive network 913 with more complex topology than as described above for different examples. Circuit 900 can produce an output 920 (e.g., Vout), as indicated. A duplicate resistive network used in a corresponding diagnostic circuit according to the present disclosure can have the same or similar topology as shown for resistive network 913.

Resistive network 913 can include pairs of resistors used as R1 resistors, as shown by 914A, 914C and 914B, 914D, configured to receive different input voltages at 902A, 902C and 902B, 902D, respectively. For example, in circuit 900, resistors 914A and 914C can be configured to receive a first differential input voltage (e.g., Vpreamp1 at 902A and 902C, respectively) while resistors 914B and 914D can be configured to receive a second input differential voltage (e.g., Vpreamp2 at 902B and 902D, respectively). Resistive network 913 can include resistors 916A-916B as R2 resistors. The R1 and R2 resistors can be configured in voltage dividers (R1/(R1+R2)) to supply desired input voltages (e.g., Vinp, Vinn) to amplifier 912, as shown.

Figure 10:
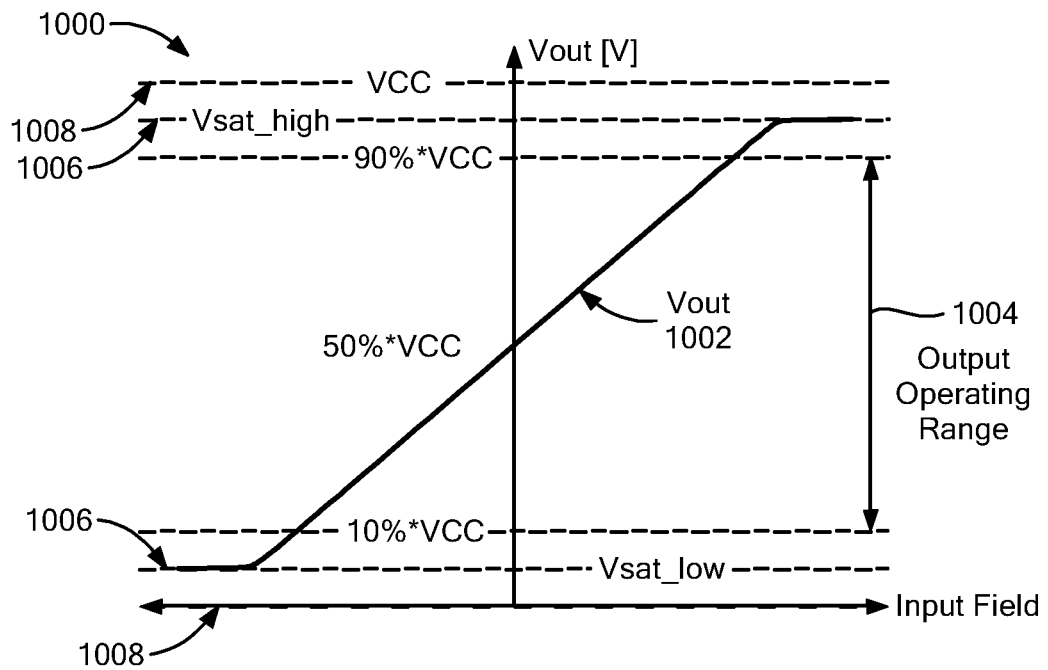
FIG. 10 is a diagram showing output buffer operating conditions, including output operating range and buffer output voltage saturation range, in accordance with the present disclosure.

FIG. 10 is a diagram 1000 showing output buffer operating conditions, in accordance with the present disclosure. Diagram 1000 includes a linear output operating range 1004 for a given output buffer (e.g., buffer 310 of FIG. 3), a buffer output voltage saturation range 1006, and a Vcc 1008. The gain or offset error safety requirements described previously (see FIG. 2) may only be guaranteed when the output buffer is operating in its linear region 1004. This linear region 1004 may be referred to as the output operating range (OOR) 1004 and may be limited by the positive and negative saturation voltage, Vsat_hi and Vsat_lo, shown by 1006.

During normal operation of an output buffer, instances may occur where the sensed field would be so high as to lead to output voltage saturation. In such an instance, a diagnostic circuit could then erroneously detect/indicate an error due to gain/offset error increase. In such a situation, it may be desirable to inhibit the diagnostic circuit so that it does not report a safety fault because no actual internal failures exist. Such inhibition may rely on detecting when Vout moves beyond its normal or desired, e.g., linear, output operating range (OOR) 1004. In examples of the present disclosure, e.g., as shown in FIGS. 11-16, this detection can be performed using two different approaches: monitoring buffer output voltage and monitoring buffer input voltage (and combining the two approaches).

Figure 11:
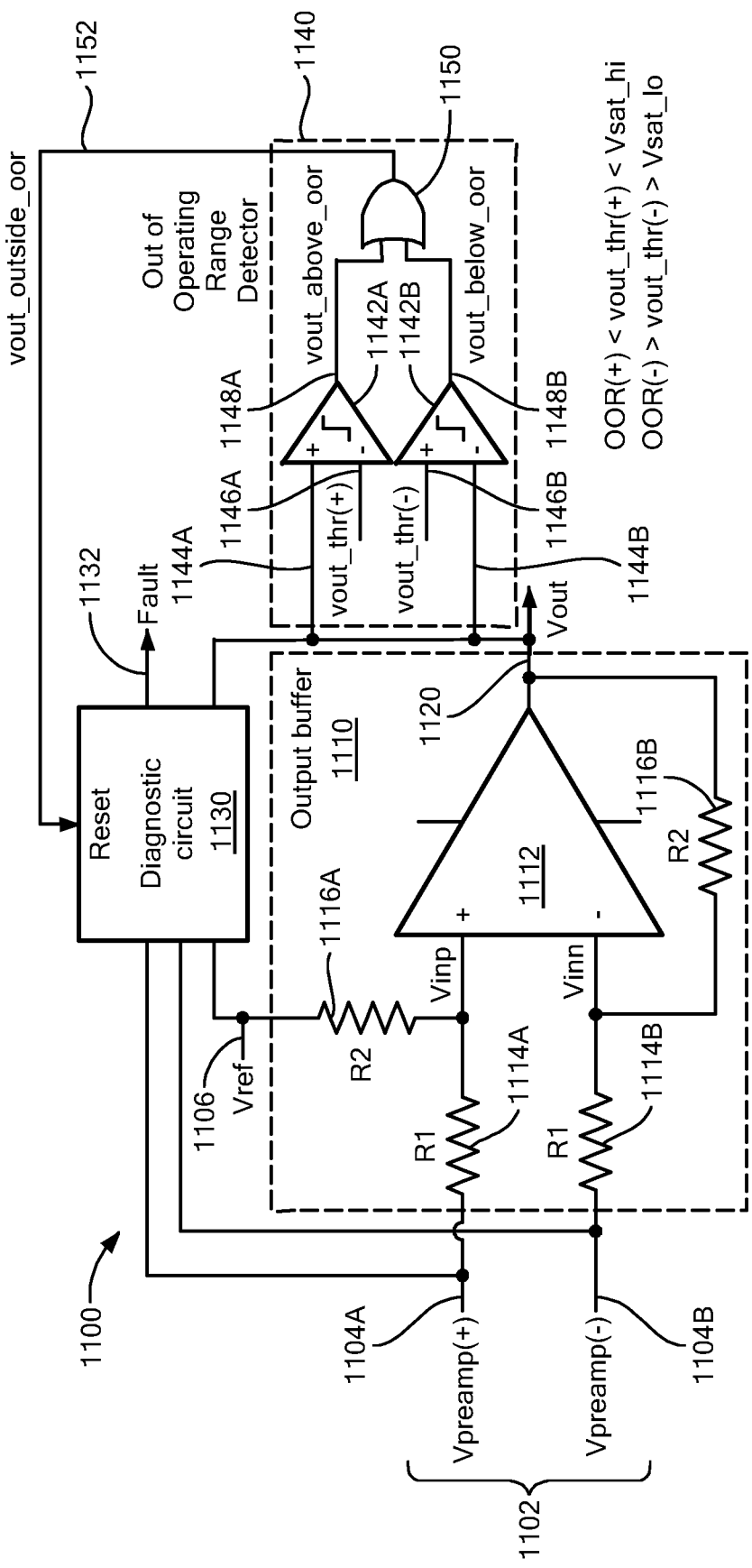
FIG. 11 is a diagram of an example output buffer diagnostic circuit including an output-operating-range (OOR) detector circuit configured to monitor buffer output voltage, in accordance with the present disclosure.

FIG. 11 is a diagram of an output buffer diagnostic circuit 1100 having an output-operating-range (OOR) detection circuit configured to monitor buffer output voltage, in accordance with the present disclosure. Circuit 1100 can operate to monitor the output of an output buffer directly and determine when the output exceeds or goes beyond the normal or desired linear OOR.

Circuit 1100 includes an analog output buffer 1110 configured to receive an input signal 1102, e.g., differential signals 1104A-B from a sensor preamp, and reference voltage 1106 and also configured to produce an output signal 1120. Buffer 1110 can include a resistor network (e.g., resistors 114A-B, 1116A-B) having a desired topology and connected to amplifier 1112 e.g., as shown. Circuit 1100 includes a diagnostic circuit 1130, e.g., including a duplicate resistive network, e.g., as shown and described above for FIG. 4, that is configured to monitor operation of output buffer 1110. Circuit 1100 may further include an OOR detector 1140 that is configured to monitor when the output signal 1120 goes out of linear output operating range (OOR).

The OOR detector 1140 can include first and second comparators 1142A-B, which can monitor when Vout 1120 goes out of OOR. The detection thresholds, i.e., vout_thr(+) and vout_thr(−), occur between the OOR limit and the saturation voltage. They can be easily generated from a resistive divider on Vcc.

When OOR detector 1140 detects that Vout has moved out of OOR, circuit 1100 can prevent a reporting of a fault condition by related diagnostic circuit 1130. For example, for embodiments utilizing a delta-sigma modulator (e.g., as shown in FIG. 7), the integrator within the delta-sigma modulator and the digital counter may be maintained under reset, preventing a Fault reporting. Operation can be resumed when the OOR detector indicates Vout is back within a desired OOR.

A potential limitation of the circuit 1100 shown in FIG. 11 may be that an output buffer may be in a fault condition where the output is stuck at one extreme or the other, e.g., where the buffer output is stuck at zero (fault type "Vout stuck at 0") or at the full value of the circuit supply voltage (fault type "Vout stuck at VCC"). Such a fault condition might not be detected by the diagnostic circuit as such a fault type would bring Vout out of the OOR. In such a case, the validity of the diagnostic operation of circuit 1100 may be guaranteed only when Vout is within its OOR. A further example of the present disclosure, which can be used to avoid such an undetected "Vout stuck" error condition, is shown in FIG. 12.

Figure 12:
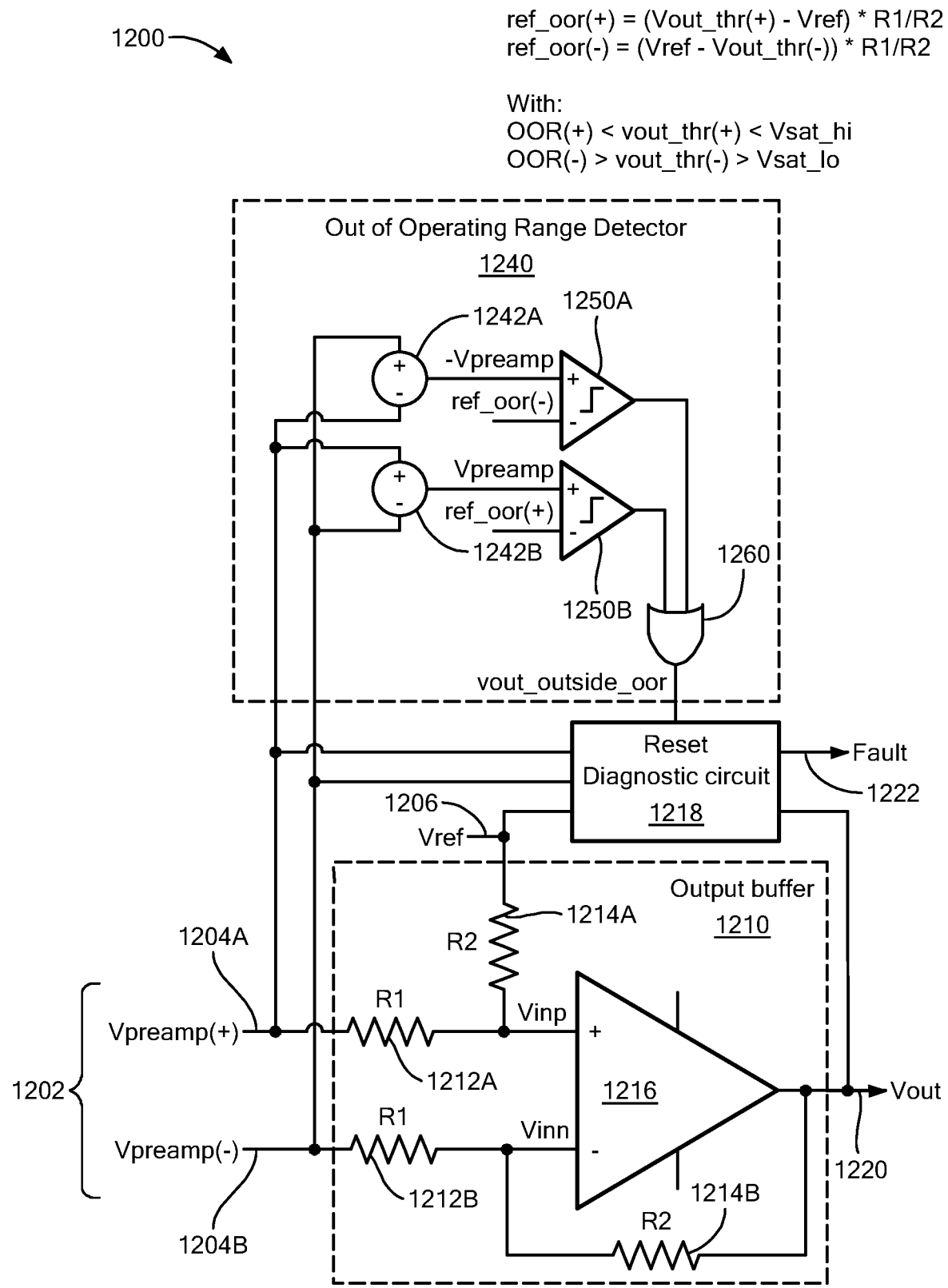
FIG. 12 is a diagram of an example output buffer diagnostic circuit including an output-operating-range (OOR) detector circuit configured to monitor buffer input voltage, in accordance with the present disclosure.

FIG. 12 is a diagram of an example output buffer diagnostic circuit 1200 having an output-operating-range (OOR) detection circuit configured to monitor buffer input voltage, in accordance with the present disclosure. Circuit 1200 can operate to monitor the input of an output buffer to determine if the input values (e.g., of Vpreamp) would lead to the output buffer output (Vout) 1220 going out of desired (linear) OOR.

Circuit 1200 may include an analog output buffer 1210 configured to receive an input signal 1202, e.g., differential inputs 1204A-B from a sensor preamp, and a reference voltage 1206 and also configured to produce an output signal (Vout) at 1220. Buffer 1210 can include a resistor network (resistors 1212A-B, 1214A-B) having a desired topology (e.g., implementing desired voltage dividers) and connected to amplifier 1216, e.g., as shown. Circuit 1200 may also include a diagnostic circuit 1218, e.g., a duplicate resistive network as shown and described above for FIG. 4, that is configured to monitor operation of output buffer 1210 including monitoring Vout produced at 1220. Diagnostic circuit 1200 may further include an OOR detector 1240 that is configured to monitor the input signal 1202 of the output buffer 1210 to determine when the input signal 1202 goes out of operating range (OOR). The OOR detector 1240 can monitor the input of the output buffer to determine if the value of Vpreamp would lead to Vout going out of OOR.

Circuit 1200 can compare Vpreamp with two different thresholds, ref_oor(+) and ref_oor(−) which are the level of Vpreamp corresponding to Vout going beyond OOR. A person of ordinary skill in the art will understand that FIG. 12 shows a higher-level, functional view of the OOR detector, and there are different possible implementations.

As an example of operation of circuit 1200, when +Vpreamp goes above ref_oor(+) or −Vpreamp above ref_oor(−), Vout is considered out of OOR, and this is indicated by signal vout_outside_oor going to logic '1'. In this case the integrator within the Sigma-Delta modulator and the digital counter are maintained under reset. Operation is resumed when the detector indicates Vout is back within OOR.

Accordingly, circuit 1200 can detect a failure when the output buffer produces a fault of the type "Vout stuck at 0" or "Vout stuck at VCC" condition while the preamp output voltage (Vpreamp) is such that the output buffer Vout would normally be within the OOR (the desired linear operating range). Thus, the type of Vout_stuck error can be detected by the diagnostic circuit 1200 and a corresponding error indication may be produced, e.g., a fault indicating "Vout stuck ASIL Error."

Figure 13:
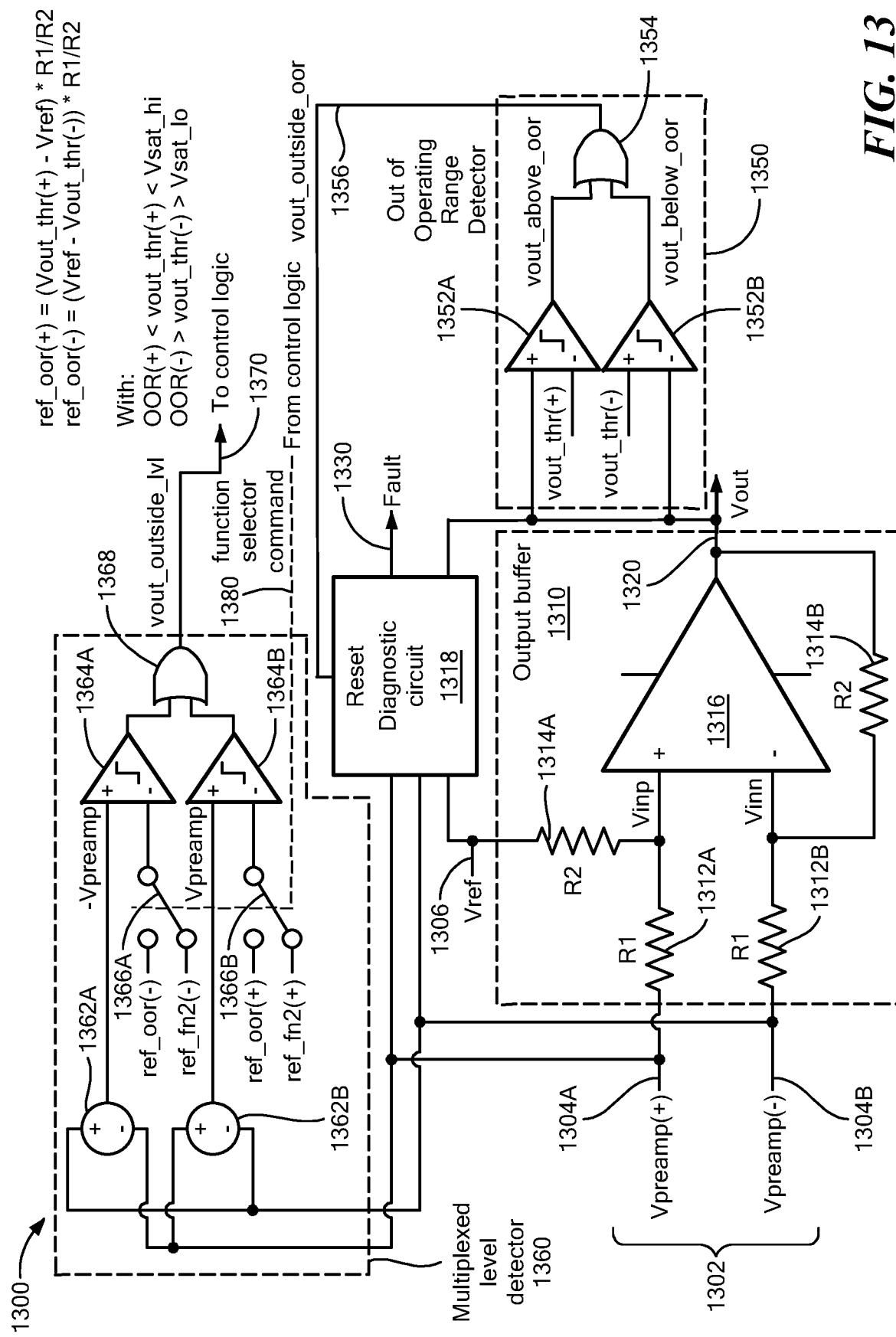
FIG. 13 is a diagram of an example output buffer diagnostic circuit including an output-operating-range (OOR) detector circuit configured to monitor buffer input voltage and output voltage, in accordance with the present disclosure.

FIG. 13 is a diagram of an example output buffer diagnostic circuit 1300 having an OOR detection circuit combining both buffer output (Vout) monitoring and buffer input monitoring, in accordance with the present disclosure. Circuit 1300 includes an analog output buffer 1310 configured to receive an input signal 1302 (e.g., a differential voltage 1304A-B from a sensor preamp) and reference voltage 1306 and to produce an output signal (Vout) 1320. Output buffer 1310 can include first resistors 1312A-B and second resistors 1314A-B in a given topology connected to an amplifier 1316 as shown. Circuit 1300 can include a diagnostic circuit 1318, e.g., including a duplicate resistive network as shown and described above for FIG. 4, that is configured to monitor operation of output buffer 1310 and produce a diagnostic output signal 1330, e.g., indicative of a fault condition.

Circuit 1300 may further include an OOR detector 1350 that is configured to monitor the output 1320 of the output buffer 1310 to determine when the output 1320 is outside of a desired linear output operating range (OOR). The OOR detector 1350 can include first and second comparators 1352A-B configured to receive the buffer output 1320 and compare it to high and low threshold values (e.g., Vout_thr(+) and Vout_thr(−)) to determine when output 1320 is outside of the linear OOR. An OR element 1354 can receive outputs from the comparator 1352A-B so the OOR detector 1350 can produce an output 1356 based on operation of either comparator 1352A or 1352B. OOR detector 1350 can produce a corresponding error signal (warning or flag), e.g., "vout_outside_oor," in the event that the buffer output 1320 is determined to be outside the OOR. When the OOR detector 1350 indicates that the buffer output is outside of the OOR, another portion of circuit 1300 can be used to monitor the input of the output buffer 1310 to determine whether a "Vout stuck at 0" or "Vout stuck at VCC" condition exists, as explained below.

To monitor the input (e.g., differential preamp voltages) of the output buffer 1310, circuit 1300 may further include a level detector 1360. Level detector 1360 can include first and second summation units 1362A-B that are configured to receive the buffer inputs 1304A-B, e.g., to form a sum and difference of the buffer inputs 1304A-B. The summation units 1362A-B can each have an inverting input as shown. Level detector 1360 can also include first and second comparators 1364A-B that are configured to receive outputs from the summation units 1362A-B, respectively. Comparators 1364A-B can compare the outputs to one or more reference values, e.g., supplied by switches 1366A-B. Switches 1366A-B can be controlled by control logic, e.g., a function selector command from an application outside of circuit 1300. Switch 1366A can selectively apply either of first and second reference voltage values ref_oor(−) and ref_fn2(−) while switch 1366B can selectively apply either of first and second reference voltage values ref_oor(+) and ref_fn2(+).

A reference voltage value, e.g., ref_fn2, may be used for a function other than the described diagnostic function of the amplifier. For example, ref_fn2 could be a threshold used to detect an "over-current event" when the input field or current is higher than a predefined value. The control logic would normally have the circuit 1360 using reference ref_fn2(+) and ref_fn2(−) to perform this other function. In the event that vout_outside_oor would go to '1', the control logic would then switch the references to ref_oor(+) and ref_oor(−) to perform the diagnostic function.

An OR element 1368 can receive outputs from the comparator 1364A-B so the level detector 1360 can produce an output 1370 based on operation of either comparator 1364A or 1364B. When a Vout stuck condition is detected, level detector 1360 may produce an output 1370 including an appropriate flag or warning signal, e.g., "Vout stuck ASIL Error".

An example of multiplexing for circuit 1300 is described as follow:

1. While vout_outside_oor=1
   a. For a fixed duration, apply vref_oor(+) and vref_oor(−) to the Multiplexed level detector to detect if Vpreamp is such that Vout should go out of 00R.
   b. Wait for the circuitry to settle after the transition before evaluation the output
   c. If Vout_outside_lvl is not set to '1', then an error warning (e.g., "Vout stuck ASIL Error") is reported.
   d. For a fixed duration, use Multiplexed level detector to detect if Vpreamp is outside another level, using ref_fn2.

Accordingly, diagnostic circuit 1300 can provide similar benefits as described for circuit 1200 shown in FIG. 12 but can provide for a smaller implementation (footprint) by re-purposing already existing circuitry. In some examples, the level detector 1360 may normally be used for another function and can be periodically repurposed ("multiplexed") to monitor the inputs to an output buffer.

Figure 14:
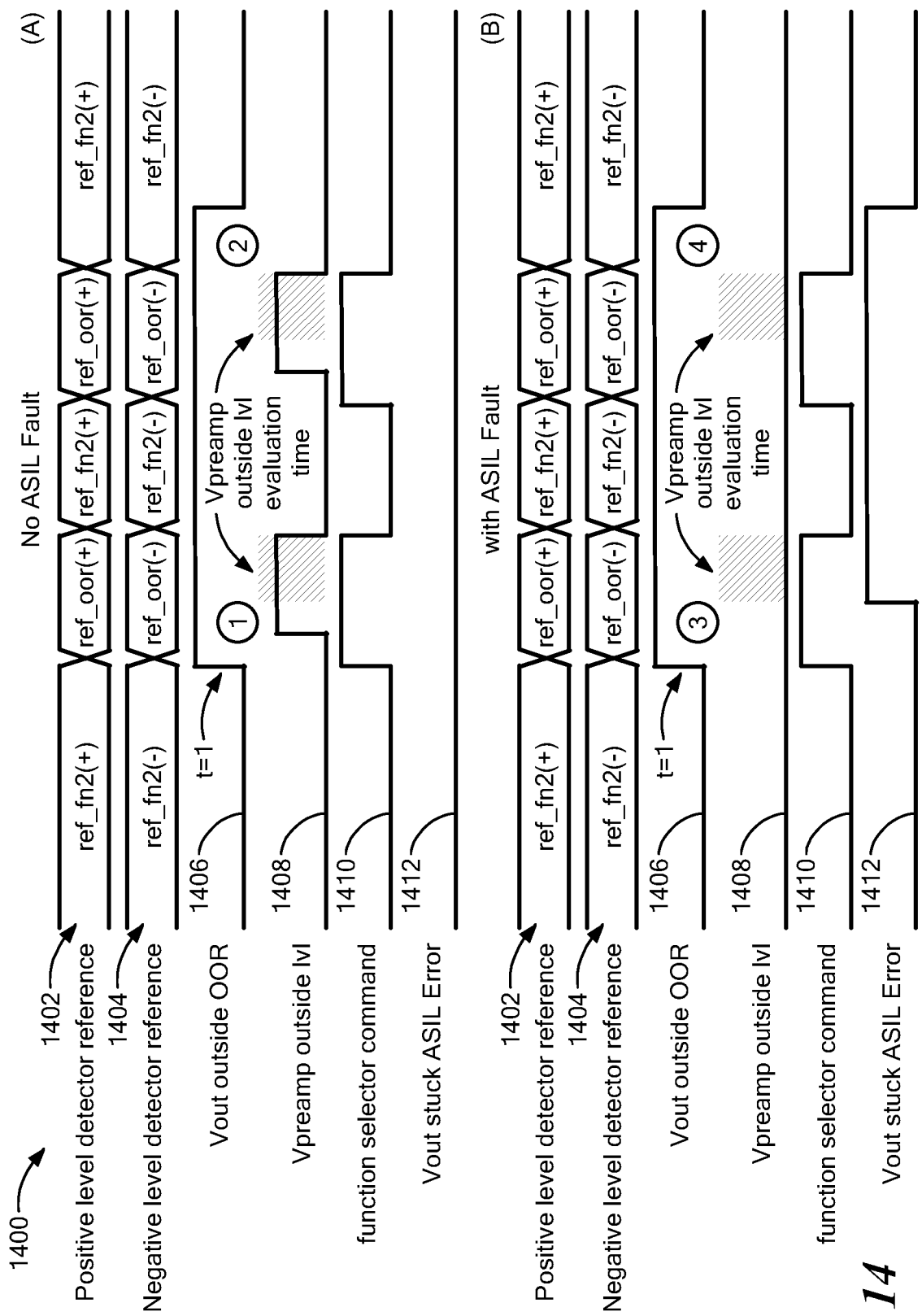
FIG. 14 is a timing diagram for the circuit of FIG. 13, in accordance with the present disclosure.

FIG. 14 shows an example timing diagram 1400 for operation of the circuit 1300 of FIG. 13, in accordance with the present disclosure. Timing diagram (chronogram) 1400 includes state conditions for positive level detector reference 1402, negative level detector reference 1404, Vout outside OOR 1406, Vpreamp outside level (abbreviated in the figure as "lvl") 1408, function selector command 1410, and Vout stuck ASIL error 1412. Two views (A)-(B) are shown corresponding to: (A) an operational state in which the buffer is operating correctly; and (B) an operational state in which the buffer output is in a stuck error (fault) condition. In view (A), showing correct operation of the monitored output buffer, the output voltage is indicated as moving outside of the linear OOR as indicated by state 1406 at t=1. As Vout is detected as being outside of the OOR, the function selector command at 1410 switches to a reference voltage to compare the buffer input voltages (i.e., Vpreamp from the related preamp) to reference values. After an evaluation settling time (shown by 1), an evaluation can be made as to whether the Vpreamp has a magnitude great enough to have caused Vout to move outside of the desired OOR. The process can be repeated (shown by 2). For a case where Vpreamp is determined to exceed the reference values, normal Vout is indicated by no fault indicator (e.g., "Vout stuck ASIL error"), as shown at 1412. View (B) shows the situation where Vpreamp is found to be below the given threshold, indicating that there is a Vout stuck error, as shown at 1412.

Figure 15:
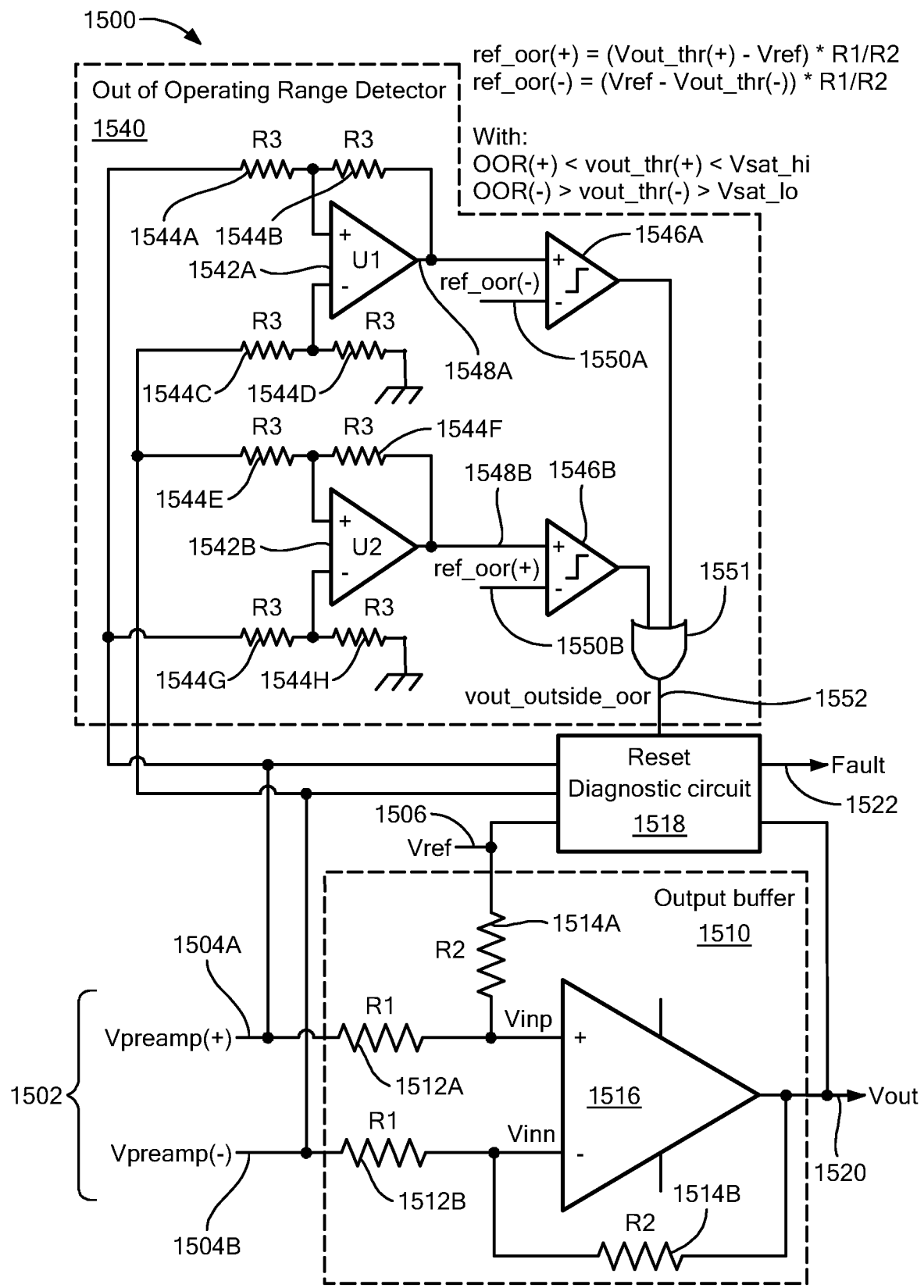
FIG. 15 is a diagram of another example of an output buffer diagnostic circuit having an output-operating-range (OOR) detector circuit configured to monitor buffer input voltage, in accordance with the present disclosure.

FIG. 15 is a diagram of a further example of an output buffer diagnostic circuit 1500 having an out-of-operating-range (OOR) detection circuit configured to monitor buffer input voltage, in accordance with the present disclosure. Circuit 1500 can monitor the input of the output buffer to determine if the input (e.g., value of Vpreamp) would lead to Vout 1520 going out of 00R.

Circuit 1500 includes an analog output buffer 1510 configured to receive an input signal 1502, e.g., differential voltages 1504A-B from a sensor preamp, and a reference voltage Vref 1506 and to produce an output signal Vout at 1520. Output buffer 1510 can include first resistors 1512A-B and second resistors 1514A-B in a given topology connected to an amplifier 1516 as shown. Circuit 1500 includes a diagnostic circuit 1518 e.g., including a duplicate resistive network as shown and described above for FIG. 4, that is configured to monitor operation of output buffer 1510. Circuit 1500 may further include an OOR detector 1540 that is configured to monitor the input signal 1502 of the output buffer 1210 to determine when the input signal 1502 would lead to Vout 1520 going out of OOR.

The OOR detector 1540 may include first and second operational amplifiers 1542A-B. OOR detector 1540 may further include a resistive network, e.g., including resistors 1544A-G, as shown. The operational amplifiers 1542A-B operate to convert the fully differential Vpreamp signal to two single-ended signals referenced to ground, one for the positive excursion of Vpreamp and one for the negative excursion. OOR detector 1540 may further include first and second comparators 1546A-B that are configured to receive the outputs 1548A-B, which are single-ended signals, produced by the operational amplifiers 1542A-B. Comparators 1546A-B may also receive reference values, e.g., reference voltage values (ref_oor(−) and ref_oor(+)) 1550A-B, respectively. OOR detector 1540 may further include an OR element 1551 configured to receive outputs from the first and second comparator 1546A-B so the level detector 1540 can produce an output 1552 based on operation of either comparator 1546A or 1546B. The output 1552 may be connected to an input of the diagnostic circuit 1518 to cause the diagnostic circuit to enter a reset condition when OOR detector 1540 indicates that either or both of the buffer inputs is/are sufficiently great enough to move the buffer output (Vout) outside of the desired OOR, as described below.

The two single-ended signals are compared with references, ref_oor(+) 1550A and ref_oor(−) 1550B, which can be computed based on Vref 1506 and the target thresholds on Vout, vout_thr(+) and Vout_thr(−) as follows:

$$\text{ref\_oor}(+)=(V\text{out\_thresh}(+)-V\text{ref})*R1/R2 \quad (\text{EQ. 5})$$

$$\text{ref\_oor}(-)=(V\text{ref}-V\text{out\_thresh}(-))*R1/R2 \quad (\text{EQ. 6})$$

with, $$\text{OOR}(+)<V\text{out\_thresh}(+)<V\text{sat\_hi} \quad (\text{INEQUALITY 1})$$

$$\text{OOR}(-)>V\text{out\_thresh}(-)>V\text{sat\_lo} \quad (\text{INEQUALITY 2})$$

When +Vpreamp goes above ref_oor(+) or −Vpreamp goes below ref_oor(−), i.e., the negative excursion goes beyond the respective threshold in the negative direction, |−Vpreamp|>|ref_oor(−)|, Vout is considered out of a desired OOR; this can be indicated by signal vout_outside_oor going to logic '1'. In this case the integrator within the delta-sigma modulator and the digital counter are maintained under reset. Operation is resumed when the detector indicates Vout is back within OOR. Thus, circuit 1500 can provide for detection of a failure within the output buffer that produces a fault of the type "Vout stuck at 0" or "Vout stuck at VCC" while Vpreamp is such that Vout should be within OOR.

Figure 16:
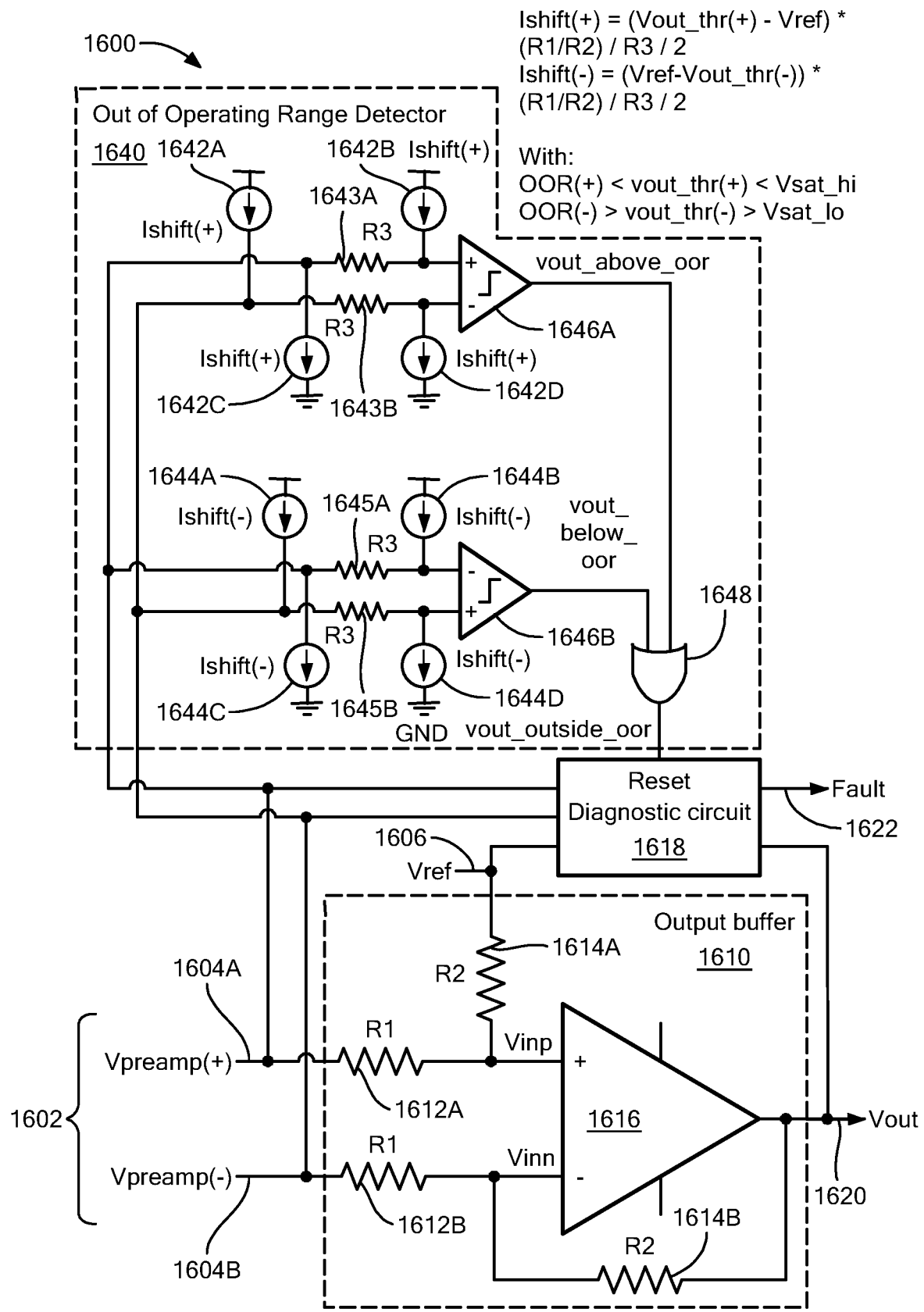
FIG. 16 is a diagram of a further example of an output buffer diagnostic circuit having an output-operating-range (OOR) detector circuit configured to monitor buffer input voltage, in accordance with the present disclosure.

FIG. 16 is a diagram of another example output buffer diagnostic circuit 1600 having an output-operating-range (OOR) detection circuit configured to monitor buffer input voltage, in accordance with the present disclosure. Circuit 1600 can monitor the input of an output buffer to determine if the value of Vpreamp would lead to Vout going out of OOR. Circuit 1600 includes an analog output buffer 1610 configured to receive an input 1602, e.g., differential voltages 1604A-B from a related sensor preamp, and to produce an output signal 1620. Output buffer 1610 can include first resistors 1612A-B and second resistors 1614A-B in a given topology connected to an amplifier 1616, e.g., as shown. Circuit 1600 includes a diagnostic circuit 1618, e.g., including a duplicate resistive network as shown and described above for FIG. 4, that is configured to monitor operation of output buffer 1610.

Circuit 1600 may further include an OOR detector 1640 that is configured to monitor the differential voltages 1604A-B supplied to the output buffer 1610 to determine if the voltages are great enough to move the output signal 1620 outside of the desired OOR. OOR detector 1640 may include multiple current sources/sinks 1642A-D and 1644A-D and resistors 1643A-B and 1645A-B.

Circuit 1600 operates similarly to circuit 1500 of FIG. 15 but with a different implementation of the OOR detector.

$$Ishift(+) = (Vout\_thresh(+) - Vref)*(R1/R2)/R3/2 \quad (EQ.\ 7)$$

$$Ishift(-) = (Vref - Vout\_thresh(-))*(R1/R2)/R3/2 \quad (EQ.\ 8)$$

with, OOR(+) and OOR(-) subject to Inequalities 1 and 2 described above for FIG. 15.

For the detection of Vout going above the OOR, Vpreamp(+) and Vpreamp(-) are shifted by an amount Vshift such that (Vpreamp(+)-Vshift)-(Vpreamp(-)+Vshift)>0 when the output voltage Vout rises above a predefined threshold, Vout_thr(+).

The Voltage Vshift can be generated by creating a voltage drop across resistances connected in series with Vpreamp(+) and Vpreamp(-). The voltage drop can be accomplished by sourcing/sinking (shift currents through R3 resistances. Vout_thr(-) can be chosen to be above the positive limit of the OOR, OOR(+), but below the saturation voltage Vsat_hi. When (Vpreamp(+)-Vshift)-(Vpreamp(-)+Vshift)>0, the signal vout_above_oor is moving to logic "1". The detection of Vout going below the OOR is performed in a similar way.

Figure 17:
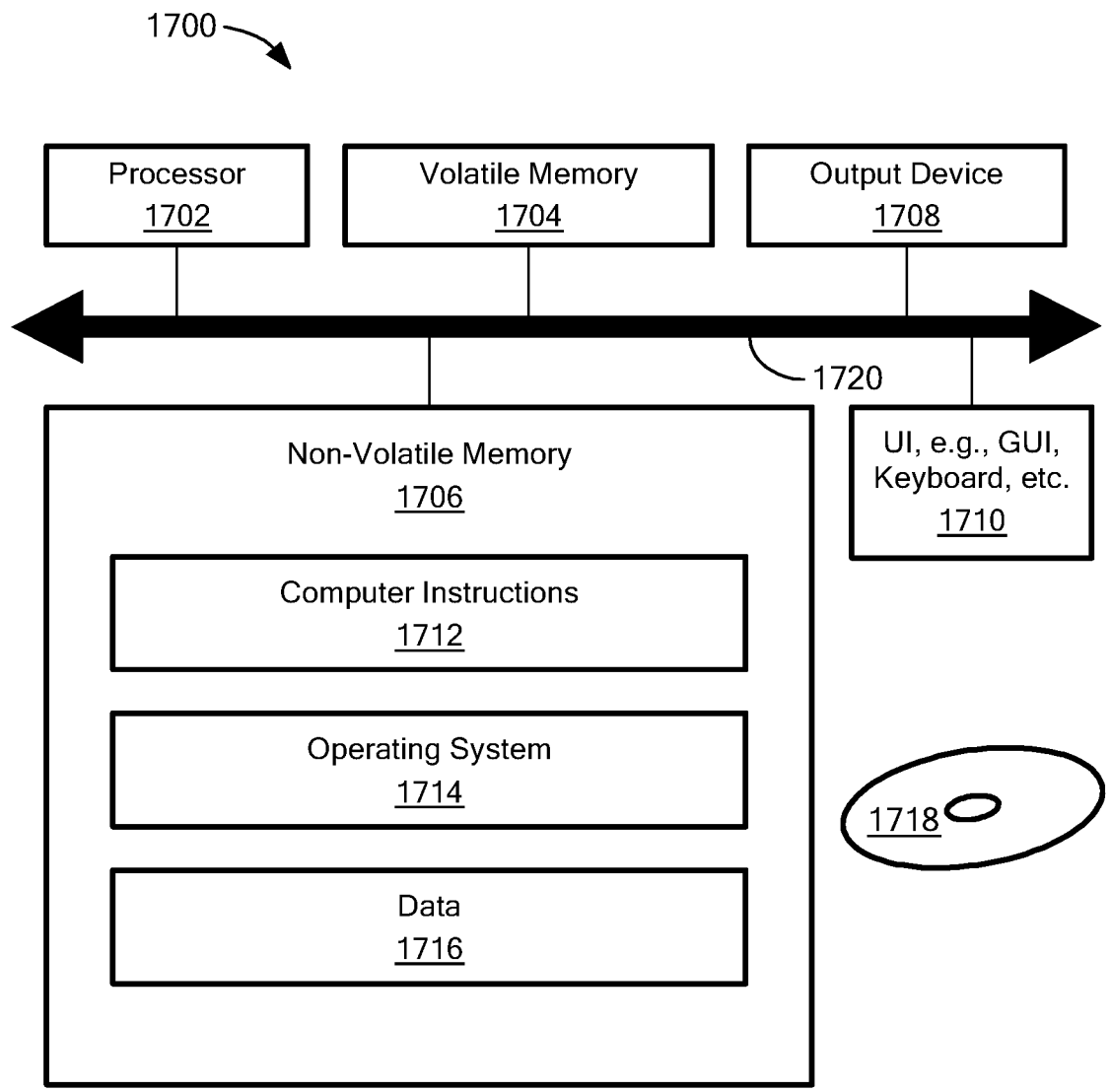
FIG. 17 is a block diagram of an example computer system operative to perform processing, in accordance with the present disclosure.

FIG. 17 is a block diagram of an example computer system 1700 operative to perform processing, in accordance with the present disclosure. Computer system 1700 can perform all or at least a portion of the processing, e.g., steps in the algorithms and methods, described herein. The computer system 1700 includes a processor 1702, a volatile memory 1704, a non-volatile memory 1706 (e.g., hard disk), an output device 1708 and a user input or interface (UI) 1710, e.g., graphical user interface (GUI), a mouse, a keyboard, a display, and/or any common user interface, etc. The non-volatile memory (non-transitory storage medium) 1706 stores computer instructions 1712 (a.k.a., machine-readable instructions or computer-readable instructions) such as software (computer program product), an operating system 1714 and data 1716. In some examples/embodiments, the computer instructions 1712 can be executed by the processor 1702 out of (from) volatile memory 1704. In some examples/embodiments, an article 1718 (e.g., a storage device or medium such as a hard disk, an optical disc, magnetic storage tape, optical storage tape, flash drive, etc.) includes or stores the non-transitory computer-readable instructions. Bus 1720 is also shown.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 1700 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. The programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit). In some examples, digital logic circuitry, e.g., one or more FPGAs, can be operative as a processor as described herein.

Accordingly, embodiments of the inventive subject matter can afford various benefits relative to prior art techniques. For example, embodiments and examples of the present disclosure can enable or facilitate e.g., systems and components achieving or obtaining an Application Safety Integration Level (ASIL) in accordance with a safety standard such as ISO 26262. Monitored output buffers can be used for various types of sensors/transducers including, but not limited to, magnetic field sensing elements such as Hall effect elements/sensors, magnetoresistance (MR) elements of any type and MR-based sensors, and inductive sensors (such as pick-ups), and current sensors, etc.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while reference is made above to buffers producing and diagnostic circuits receiving/monitoring differential signals, examples and embodiments of the present disclosure can be configured to process and monitor single-ended signals as a person of ordinary skill in the art would understand.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. An output buffer diagnostic circuit for a sensor output buffer, wherein the sensor output buffer is configured to produce a buffer output voltage signal, wherein the sensor output buffer includes a resistive network having a topology and configured to receive a differential input signal, the buffer output voltage signal, and a reference voltage, the diagnostic circuit comprising:

a. a duplicate resistive network configured to receive the differential input signal supplied to the sensor output buffer, the buffer output voltage signal and the reference voltage, wherein the duplicate resistive network comprises the same topology as the resistive network of the sensor output buffer, wherein the duplicate resistive network is configured to produce a differential duplicate signal based on the differential input signal, the buffer output voltage signal and the reference voltage and wherein the differential duplicate signal is indicative of when an error condition exits in the sensor output buffer;

b. averaging circuitry configured to receive the differential duplicate signal and produce an average duplicate signal; and c. an error comparison circuit configured to receive the average duplicate signal and detect when the average duplicate signal exceeds an error value corresponding to an error condition in the sensor output buffer, and wherein the error comparison circuit is configured to produce an error indication when the average duplicate signal exceeds the error value.

2. The circuit of claim 1, wherein the duplicate resistive network comprises R1 and R2 resistors, and wherein the ratio of resistances of the R1 to R2 resistors is the same as that of corresponding resistors in the resistive network of the output buffer.

3. The circuit of claim 1, wherein the duplicate differential signal corresponds to a differential input signal applied to an amplifier in the resistive network of the output buffer.

4. The circuit of claim 1, wherein the averaging circuitry comprises a delta-sigma modulator configured to convert the differential duplicate signal to a bitstream.

5. The circuit of claim 4, further comprising a digital filter connected to the delta-sigma modulator, wherein the digital filter includes a digital counter configured to average the bitstream produced by the delta-sigma modulator.

6. The circuit of claim 1, further comprising an output-operating-range (OOR) detector configured to determine when the sensor output buffer is operating outside of a linear output operating range.

7. The circuit of claim 6, wherein the OOR detector is configured to monitor the buffer output signal.

8. The circuit of claim 7, wherein the OOR detector comprises:
a first comparator configured to receive the buffer output signal and compare the buffer output signal to a positive threshold, wherein the first comparator is configured to produce an above-threshold signal when the buffer output signal exceeds the positive threshold;
a second comparator configured to receive the buffer output signal and compare the buffer output signal to a negative threshold, wherein the second comparator is configured to produce a below-threshold signal when the buffer output signal is below the negative threshold; and
a logical OR unit connected to the first and second comparators and configured to, in response to receiving an above-threshold signal or a below-threshold signal, produce an output signal indicating the buffer output signal is outside of the linear operating range.

9. The circuit of claim 8, wherein the output buffer diagnostic circuit is configured to enter a reset condition in response to receiving the OOR detector output signal indicating the buffer output signal is outside of the linear operating range, wherein operation of the output buffer diagnostic circuit is paused during the reset condition.

10. The circuit of claim 8, further comprising a level detector configured to determine when the differential input signal exceeds a threshold value magnitude indicative of the buffer output signal moving outside of the linear output operating range.

11. The circuit of claim 6, wherein the OOR detector is configured to monitor the differential input signal supplied to the sensor output buffer.

12. The circuit of claim 11, wherein the OOR detector comprises:
conversion circuitry configured to convert the differential input signal into two single-ended signals referenced to ground, wherein the two single-ended signals include a positive excursion signal and a negative excursion signal;
a first comparator configured to receive the positive excursion signal and compare the positive excursion signal to a positive threshold, wherein the first comparator is configured to produce an above-threshold signal when the positive excursion signal exceeds the positive threshold;
a second comparator configured to receive the negative excursion signal and compare the negative excursion signal to a negative threshold, wherein the second comparator is configured to produce a below-threshold signal when the negative excursion signal is below the negative threshold; and
an error detection unit configured to, in response to receiving an above-threshold signal or a below-threshold signal, produce an out-of-operating range (OOR) output signal indicating the buffer output signal is outside of the linear operating range.

13. The circuit of claim 11, wherein the output buffer diagnostic circuit is configured to enter a reset condition in response to receiving the OOR detector output signal, where operation of the output buffer diagnostic circuit is paused during the reset condition.

14. The circuit of claim 11, wherein the OOR detector comprises:
a first comparator configured to receive a positive excursion signal of the differential input signal and compare the positive excursion signal to a positive threshold, wherein the first comparator is configured to produce an above-threshold signal when the positive excursion signal exceeds the positive threshold;
a second comparator configured to receive a negative excursion signal of the differential input and compare the negative excursion signal to a negative threshold, wherein the second comparator is configured to produce a below-threshold signal when the negative excursion signal is below the negative threshold; and
an error detection unit configured to, in response to receiving an above-threshold signal or a below-threshold signal, produce an output signal indicating the buffer output signal is outside of the linear operating range.

15. The circuit of claim 14, further comprising a plurality of resistors, wherein each input of the first and second comparators is connected to a respective resistor of the plurality of resistors.

16. The circuit of claim 15, wherein each resistor is connected to a respective current source and a respective current sink configured to cause a desired voltage-drop across the resistor.

17. The circuit of claim 1, further comprising the sensor output buffer including the resistive network having a topology.

18. The circuit of claim 17, wherein the topology comprises a summing configuration for receiving first and second differential input signals.

19. The circuit of claim 17, wherein the sensor output buffer is configured to receive the differential input signal from a sensor circuit including a sensor.

20. The circuit of claim 19, wherein the sensor comprises a magnetic field sensor.

21. The circuit of claim 20, wherein the magnetic field sensor comprises one or more Hall effect elements.

22. The circuit of claim 20, wherein the magnetic field sensor comprises one or more magnetoresistance elements.

23. The circuit of claim 19, wherein the sensor comprises a current sensor.

24. The circuit of claim 1, wherein the differential input signal comprises a differential voltage signal.

25. The circuit of claim 1, wherein the buffer output signal comprises a voltage signal.

26. An output buffer diagnostic circuit for a sensor output buffer, wherein the sensor output buffer is configured to produce a buffer output voltage signal, wherein the sensor output buffer includes a resistive network having a topology and configured to receive a differential input signal, the buffer output voltage signal, and a reference voltage, the diagnostic circuit comprising:
  a. a duplicate resistive network configured to receive the differential input signal and produce a differential duplicate signal based on the differential input signal, wherein duplicate resistive network comprises the same topology as the resistive network of the output buffer, wherein the differential duplicate signal is indicative of whether an error condition exits in the sensor output buffer;
  b. conversion circuitry configured to receive the differential duplicate signal and produce a single-ended duplicate signal; and
  c. an error comparison circuit configured to receive the single-ended duplicate signal and detect when the single-ended duplicate signal exceeds an error value corresponding to an error condition in the sensor output buffer, and wherein the error comparison circuit is configured to produce an error indication when the single-ended duplicate signal exceeds the error value.

27. The circuit of claim 26, wherein the conversion circuitry comprises averaging circuitry configured to receive the differential duplicate signal and produce an average duplicate signal, wherein the single-ended duplicate signal comprises the average duplicate signal.

28. The circuit of claim 26, further comprising an output-operating-range diagnostic circuit configured to determine when the sensor output buffer is operating outside of a linear output operating range, wherein the output-operating-range diagnostic circuit is further configured to produce an error warning when the sensor output buffer is operating outside of a linear output operating range.

29. The circuit of claim 28, wherein the output-operating-range diagnostic circuit is configured to monitor the buffer output signal.

30. The circuit of claim 28, wherein the output-operating-range diagnostic circuit is configured to monitor the differential input signal supplied to the sensor output buffer.

31. The circuit of claim 26, further comprising the sensor output buffer including the resistive network having a topology.

32. The circuit of claim 31, wherein the sensor output buffer is configured to receive the differential input signal from a sensor circuit including a sensor.

33. The circuit of claim 32, wherein the sensor circuit further includes a pre-amplifier configured to receive a sensor output signal from the sensor and to produce a pre-amplifier output signal comprising an amplified version of the sensor output signal, wherein the sensor output buffer is configured to receive the pre-amplifier output signal.

34. The circuit of claim 33, wherein the sensor comprises a current sensor.

35. The circuit of claim 26, wherein the differential input signal comprises a differential voltage signal.

36. The circuit of claim 26, wherein the buffer output signal comprises a voltage signal.

* * * * *

UNITED STATES PATENT AND TRADEMARK OFFICE
CERTIFICATE OF CORRECTION

PATENT NO. : 12,153,073 B2
APPLICATION NO. : 18/053905
DATED : November 26, 2024
INVENTOR(S) : Matthieu Thomas et al.

Page 1 of 1

It is certified that error appears in the above-identified patent and that said Letters Patent is hereby corrected as shown below:

In the Specification

Column 5, Line 6, delete "delta-signal" and replace with --delta-sigma--.
Column 8, Line 36, delete "(A)" and replace with --(Δ)--.
Column 8, Line 41, delete "OR" and replace with --OOR--.
Column 9, Line 4, delete "716" and replace with --706--.
Column 9, Line 36, delete "OR" and replace with --OOR--.
Column 10, Line 25, delete "(00R)" and replace with --(OOR)--.
Column 11, Line 56, delete "-Vpreamp above" and replace with -- -Vpreamp goes above--.
Column 12, Line 28, delete "comparator" and replace with --comparators--.
Column 13, Line 1-2, delete "comparator" and replace with --comparators--.
Column 13, Line 13, delete "00R." and replace with --OOR.--.
Column 14, Line 23, delete "OR" and replace with --OOR--.
Column 14, Line 25, delete "comparator" and replace with --comparators--.
Column 14, Line 35, delete ", ref_oor(+) 1550A and ref_oor(-) 1550B," and replace with --, ref_oor(-) 1550A and ref_oor(+) 1550B,--.
Column 15, Line 34, delete "OOR. OOR(+)" and replace with --OOR(-). OOR(+)--.

In the Claims

Column 19, Line 49, delete "OR" and replace with --OOR--.

Signed and Sealed this
Third Day of June, 2025

Coke Morgan Stewart
*Acting Director of the United States Patent and Trademark Office*